(12) United States Patent
Lee et al.

(10) Patent No.: US 12,022,676 B2
(45) Date of Patent: Jun. 25, 2024

(54) DISPLAY PANEL HAVING CATHODE ELECTRODE IN CONTACT WITH CONNECTION ELECTRODE IN SHADE REGION AND METHOD OF MANUFACTURING SAME

(71) Applicant: LG Display Co., Ltd., Seoul (KR)

(72) Inventors: Jeongwon Lee, Paju-si (KR); Jaeki Lee, Paju-si (KR); Seonghyun Kim, Paju-si (KR); Changyong Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 57 days.

(21) Appl. No.: 17/138,179

(22) Filed: Dec. 30, 2020

(65) Prior Publication Data
US 2021/0202889 A1 Jul. 1, 2021

(30) Foreign Application Priority Data
Dec. 31, 2019 (KR) .......................... 10-2019-0179742

(51) Int. Cl.
*H10K 50/824* (2023.01)
*H10K 50/813* (2023.01)
(Continued)

(52) U.S. Cl.
CPC ......... *H10K 50/824* (2023.02); *H10K 50/813* (2023.02); *H10K 50/822* (2023.02); *H10K 71/00* (2023.02)

(58) Field of Classification Search
CPC ............. H01L 51/5228; H01L 51/5209; H01L 51/5225; H01L 51/156
(Continued)

(56) References Cited

U.S. PATENT DOCUMENTS

2014/0183479 A1* 7/2014 Park ................... H01L 27/3216
 438/34
2015/0097171 A1* 4/2015 Kim .................... H01L 51/5234
 438/23
(Continued)

FOREIGN PATENT DOCUMENTS

CN 106992198 A 7/2017
CN 107039491 A 8/2017
(Continued)

OTHER PUBLICATIONS

Extended European Search Report dated Jun. 8, 2021 issued in corresponding Patent Application No. 20217261.5 (9 pages).
(Continued)

*Primary Examiner* — Sheng-Bai Zhu
(74) *Attorney, Agent, or Firm* — POLSINELLI PC

(57) ABSTRACT

A display panel includes a substrate including an emission area and a non-emission area; an auxiliary electrode placed in the non-emission area, and supplied with power for driving the display panel; a protective layer placed on the auxiliary electrode; a contact hole penetrating through the protective layer, and exposing the auxiliary electrode; a connection electrode placed in such a manner as to be in contact with the auxiliary electrode within the contact hole; an electron auxiliary layer placed on the connection electrode; a cathode electrode placed on the electron auxiliary layer; and a protrusion formed protruding from the connection electrode, wherein the protrusion is formed in such a manner as to form a shade region on the connection electrode, and the cathode electrode is in contact with the connection electrode in the shade region.

14 Claims, 23 Drawing Sheets

(51) Int. Cl.
*H10K 50/822* (2023.01)
*H10K 71/00* (2023.01)

(58) Field of Classification Search
USPC .......................................................... 257/40
See application file for complete search history.

(56) References Cited

U.S. PATENT DOCUMENTS

| | | | |
|---|---|---|---|
| 2016/0013438 A1* | 1/2016 | Im | H10K 59/1315 |
| | | | 257/762 |
| 2016/0043341 A1* | 2/2016 | Heo | H10K 59/122 |
| | | | 438/23 |
| 2017/0133620 A1* | 5/2017 | Lee | H01L 51/0031 |
| 2017/0186831 A1* | 6/2017 | Nam | H01L 27/3272 |
| 2018/0062109 A1* | 3/2018 | Kim | H01L 51/5209 |
| 2018/0166015 A1 | 6/2018 | Beak et al. | |
| 2020/0203469 A1* | 6/2020 | Li | H10K 59/1315 |

FOREIGN PATENT DOCUMENTS

| | | | |
|---|---|---|---|
| CN | 107799663 A | | 3/2018 |
| CN | 108231830 A | | 6/2018 |
| CN | 110447107 | * | 11/2019 |
| EP | 3 188 274 A1 | | 7/2017 |
| KR | 20190122455 | * | 10/2019 |

OTHER PUBLICATIONS

Chinese Office Action dated Dec. 19. 2023 issued in Patent Application No. 202011504103.3. w/English Translation (15 pages).

* cited by examiner

DISPLAY PANEL HAVING CATHODE ELECTRODE IN CONTACT WITH CONNECTION ELECTRODE IN SHADE REGION AND METHOD OF MANUFACTURING SAME

CROSS-REFERENCE TO RELATED APPLICATION

The present application claims priority to Korean Patent Application No. 10-2019-0179742, filed on Dec. 31, 2019, which is hereby incorporated by reference in its entirety.

BACKGROUND

Field of the Disclosure

The present disclosure relates to a display panel, and a method of manufacturing the same.

Description of the Background

A display panel includes pixels capable of outputting light. Examples of the display panel include a liquid-crystal display (LCD) panel, a plasma display panel (PDP), and an organic light-emitting diode (OLED) display panel.

Organic light-emitting diodes constituting the OLED panel are self-luminous, and a separate light source is not required. Accordingly, the thickness and the weight of the display device including the OLED panel may be relatively reduced. In addition, the display device including the OLED panel may have high quality characteristics, such as low power consumption, high luminance, a high response rate, and the like.

The foregoing is intended merely to aid in the understanding of the background of the present disclosure, and is not intended to mean that the present disclosure falls within the purview of the related art that is already known to those skilled in the art.

SUMMARY

Accordingly, the present disclosure is to provide a display panel, and a method of manufacturing the same, wherein power is supplied stably to a light-emitting element and the display panel has excellent operating characteristics.

According to aspects of the present disclosure, there is provided a display panel including: a substrate including an emission area and a non-emission area; an auxiliary electrode placed in the non-emission area, and supplied with power for driving the display panel; a protective layer placed on the auxiliary electrode; a contact hole penetrating through the protective layer, and exposing the auxiliary electrode; a connection electrode placed in such a manner as to be in contact with the auxiliary electrode within the contact hole; an electron auxiliary layer placed on the connection electrode; a cathode electrode placed on the electron auxiliary layer; and a protrusion formed protruding from the connection electrode, wherein the protrusion is formed in such a manner as to form a shade region on the connection electrode, and the cathode electrode is in contact with the connection electrode in the shade region.

According to aspects of the present disclosure, there is provided a method of manufacturing a display panel, the method including: forming an auxiliary electrode placed in a non-emission area of a substrate, and supplied with power for driving the display panel; forming a protective layer on the auxiliary electrode; forming, in the protective layer, a contact hole that exposes the auxiliary electrode; forming a connection electrode placed in such a manner as to be in contact with the auxiliary electrode within the contact hole; forming a protrusion that protrudes from the connection electrode and forms a shade region on the connection electrode; depositing an electron auxiliary layer on the connection electrode; and forming a cathode electrode in such a manner as to be in contact with the connection electrode in the shade region.

According to aspects of the present disclosure, an electrode corresponding to the cathode electrode of light-emitting element may be connected to the auxiliary wire through the connection electrode, so that power supplied through the auxiliary wire may be supplied stably to the cathode electrode.

Accordingly, power may be supplied stably to the light-emitting element of the aspects of the present disclosure, so that the operating characteristics may be enhanced.

BRIEF DESCRIPTION OF THE DRAWINGS

The above features and other advantages of the present disclosure will be more clearly understood from the following detailed description when taken in conjunction with the accompanying drawings, in which.

DETAILED DESCRIPTION

Hereinafter, aspects of the present disclosure will be described with reference to the accompanying drawings.

Figure 1:
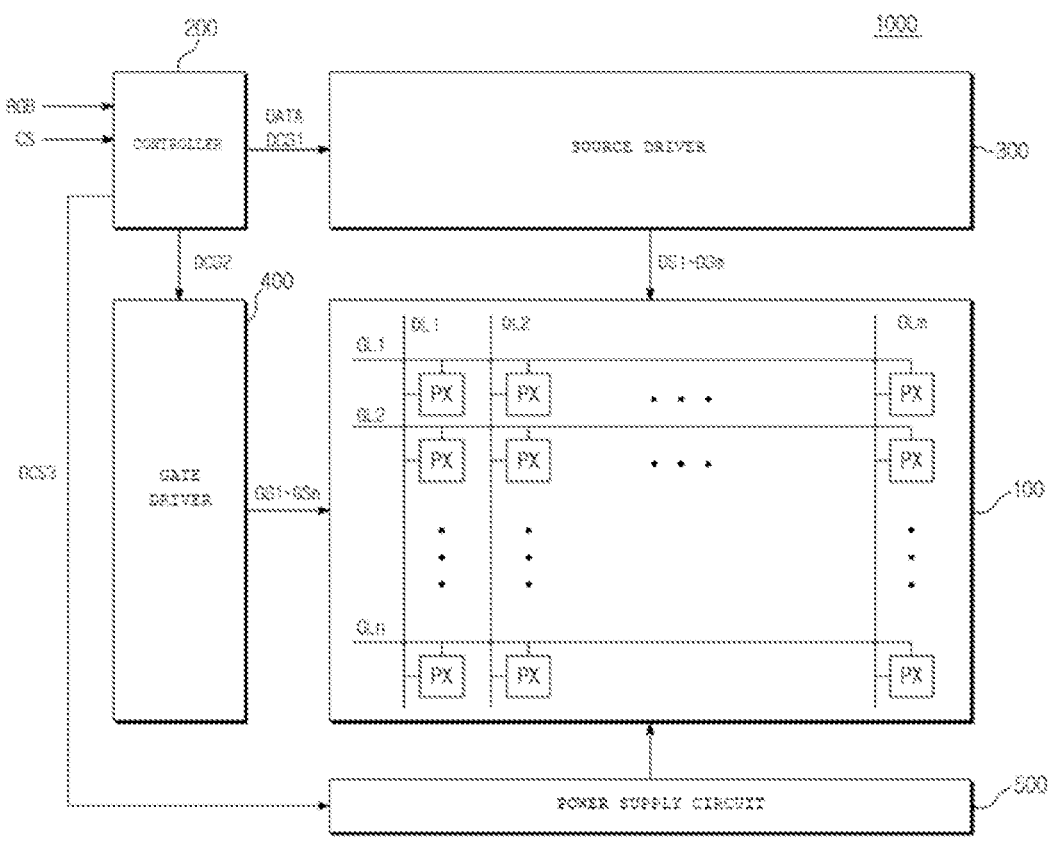
FIG. 1 is a diagram showing a display device according to aspects of the present disclosure.

FIG. 1 is a diagram showing a display device according to aspects of the present disclosure. Referring to FIG. 1, a display device 1000 may include a display panel 100, a controller 200, a source driver 300, a gate driver 400, and a power supply circuit 500.

The display device 1000 may be a device capable of displaying images and videos. For example, the display device 1000 may refer to a TV, a smartphone, a tablet personal computer (PC), a mobile phone, a video phone, an e-book reader, a computer, a camera, a wearable device, or the like, but is not limited thereto.

The display panel 100 may include multiple pixels (or subpixels) PXs arranged in rows and columns. According to aspects, the multiple pixels PXs shown in FIG. 1 may be arranged in a grid structure composed of n rows and m columns (n and m are natural numbers).

For example, the display panel 100 may be implemented as one among a liquid crystal display (LCD), a light-emitting diode (LED) display, an organic light-emitting diode (OLED) display, an active-matrix organic light-emitting diode (AMOLED) display, an electrochromic display (ECD), a digital mirror device (DMD), an actuated mirror device (AMD), a grating light valve (GLV), a plasma display panel (PDP), an electroluminescent display (ELD), and a vacuum fluorescent display (VFD), but is not limited thereto.

According to aspects, the display panel 100 may include: n gate lines GL1 to GLn arranged in m rows; and m data lines DL1 to DLm arranged in m columns. The pixels PXs may be placed at intersections of the gate lines GL1 to GLn and the data lines DL1 to DLm.

The pixels PXs may be a basic unit for outputting light. Each of the pixels PXs may include a driving element. According to aspects, the light output from each of the pixels PXs may have any one among red, green, and blue colors, but is not limited thereto. For example, white light may be output from the pixel PX.

According to aspects, the pixels PXs may include a light-emitting element configured to emit light, and a light-emitting element driving circuit driving the light-emitting element. The light-emitting element driving circuit may be connected to one gate line and one data line. The light-emitting element may be positioned between the light-emitting element driving circuit and a power supply voltage (for example, a ground voltage) for connection.

According to aspects, the light-emitting element may be a light-emitting diode (LED), an organic light-emitting diode (OLED), a quantum-dot light-emitting diode (QLED), or a micro light-emitting diode (LED), but the aspects of the present disclosure are not limited to the type of light-emitting element.

The pixels PXs of the display panel 100 may be driven on a per-gate line basis. For example, pixels arranged in one gate line may be driven during a first period, and pixels arranged in another gate line may be driven during a second period after the first period. Herein, a unit time period in which the pixels PXs are driven may be referred to as one horizontal period (1 horizontal (1H) time).

The light-emitting element driving circuit may include a switching element connected to the gate lines GL1 to GLn, for example, a thin-film transistor (TFT). When a gate-on signal is applied through the gate lines GL1 to GLn and the switching element is turned on, the light-emitting element driving circuit supplies, to the light-emitting element, a data signal (or a pixel signal) received through the data lines DL1 to DLm connected to the light-emitting element driving circuit. The light-emitting element may output light corresponding to an image signal.

The controller 200 may receive an image signal RGB from the outside, and may perform image processing on the image signal RGB or conversion to make the image signal appropriate for a structure of the display panel 100, thereby generating an image data DATA. The controller 200 may transmit the image data DATA to the source driver 300.

The controller 200 may receive a control signal CS from an external host device. The control signal CS may include a horizontal synchronization signal, a vertical synchronization signal, and a clock signal, but is not limited thereto.

The controller 200 may generate, on the basis of the received control signal CS, a first driving control signal DCS1 for controlling the source driver 300, a second driving control signal DCS2 for controlling the gate driver 400, and a third driving control signal DCS2 for controlling the power supply circuit 500.

The controller 200 may transmit the first driving control signal DCS1 to the source driver 300, may transmit the second driving control signal DCS2 to the gate driver 400, and may transmit the third driving control signal DCS3 to the power supply circuit 500.

The source driver 300 may generate, on the basis of image data DATA and the first driving control signal DCS1, data signals DS1 to DSm corresponding to an image displayed on the display panel 100, and may transmit the generated data signals DS1 to DSm to the display panel 100. The data signals DS1 to DSm may be transmitted to the pixels PXs, respectively. For example, during a 1H period, the source driver 300 may provide data signals DS1 to DSm to be displayed in the 1H period, to the pixels PXs driven in the 1H period through the data lines DL1 to DLm.

The gate driver 400 may provide gate signals GS1 to GSn sequentially to the multiple gate lines GL1 to GLn in response to the second driving control signal DCS2. Each of the gate signals GS1 to GSn is a signal for turning on the pixel PXs connected to each of the gate lines GL1 to GLn, and may be applied to a gate terminal of a transistor included in each of the pixels PXs.

The power supply circuit 500 may generate, on the basis of the third driving control signal DCS3, a driving voltage DV to be provided to the display panel 100, and may transmit the generated driving voltage DV to the display panel 100. The driving voltage DV may include a low-potential driving voltage, and a high-potential driving voltage having higher potential than the low-potential driving voltage. According to aspects, the power supply circuit 500 may transmit the low-potential driving voltage and the high-potential driving voltage individually to each of the pixels PXs through separate power lines.

In this specification, the source driver 300 and the gate driver 400 may be referred to as a panel driving circuit.

According to aspects, at least two among the controller 200, the source driver 300, and the gate driver 400 may be implemented as one integrated circuit. In addition, according to aspects, the source driver 300 or the gate driver 400 may be implemented as being mounted on the display panel 100. In addition, according to aspects, the power supply circuit 500 may be positioned outside the display panel 100.

Figure 2:
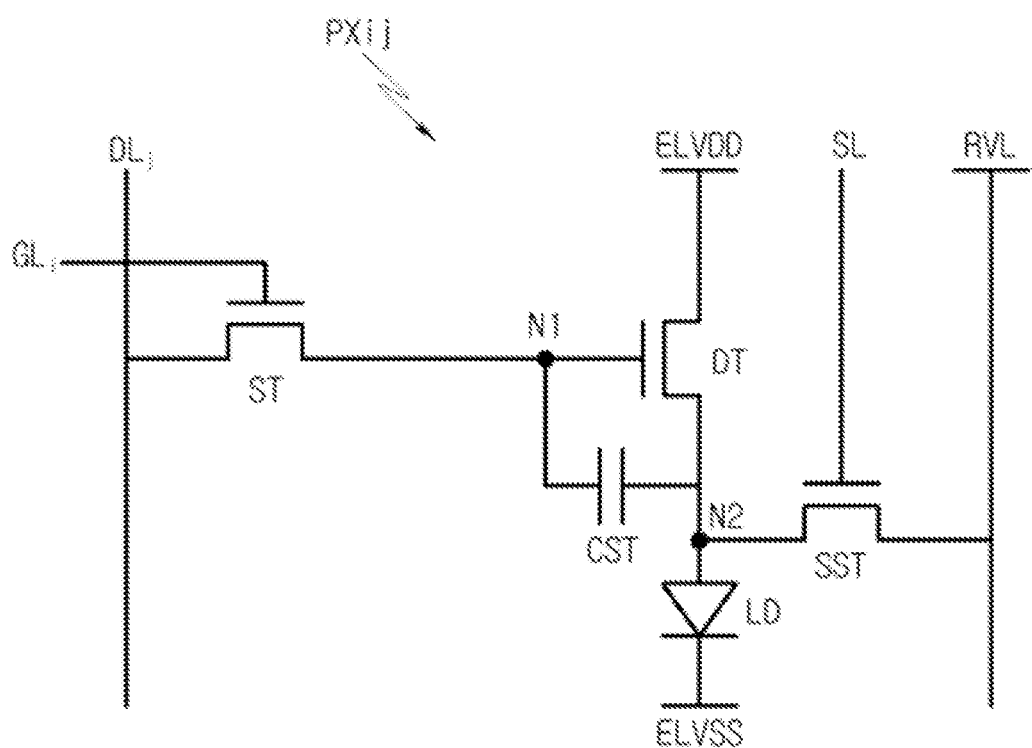
FIG. 2 is a diagram showing a pixel according to aspects of the present disclosure.

FIG. 2 is a diagram showing a pixel according to aspects of the present disclosure. FIG. 2 shows, as an example, a pixel PXij that is connected to an i-th gate line GLi ($1 \leq i \leq n$) and a j-th data line DLj ($1 \leq j \leq m$).

Referring to FIGS. 1 and 2, the pixel PX may include a switching transistor ST, a driving transistor DT, a storage capacitor CST, a sensing transistor SST, and a light-emitting element LD. The switching transistor ST and the driving transistor DT may be referred to as driving elements.

A first electrode (for example, a source electrode) of the switching transistor ST is electrically connected to the j-th data line DLj, and a second electrode (for example, a drain electrode) of the switching transistor ST is electrically connected to a first node N1. A gate electrode of the switching transistor ST is electrically connected to the i-th gate line GLi. The switching transistor ST is turned on when a gate signal at a gate-on level is applied to through the i-th gate line GLi, and transmits a data signal applied through the j-th data line DLj, to the first node N1.

A first electrode of the storage capacitor CST is electrically connected to the first node N1, and a second electrode of the storage capacitor CST receives a high-potential driving voltage ELVDD. The storage capacitor CST may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage provided to the gate electrode.

A first electrode (for example, a source electrode) of the sensing transistor SST is electrically connected to a second node N2, and a second electrode (for example, a drain electrode) of the sensing transistor SST is electrically connected to a reference voltage line RVL. A gate electrode of the sensing transistor SST is electrically connected to a sensing line SL. The switching transistor ST may be turned on the basis of a sensing voltage transmitted through the sensing line SL, and may apply a reference voltage transmitted through the reference voltage line RVL, to the first electrode (for example, the source electrode) of the driving transistor DT through the second node N2.

In addition, the sensing transistor SST may detect the degree of deterioration of the pixel PX (or the driving transistor DT), and may transmit a result of detection to the source driver 300. For example, the sensing transistor SST may sense a threshold voltage of the pixel PXij to identify the degree of deterioration of the pixel PXij. Specifically, the sensing transistor SST may sense the threshold voltage by detecting the voltage of the second node N2.

The light-emitting element LD outputs light corresponding to the driving current. The light-emitting element LD may output light corresponding to any one among red, green, blue, and white colors. The light-emitting element LD may be an organic light-emitting diode (OLED) or an ultra-small inorganic light-emitting diode having a size in a micro to nanoscale range, but is not limited thereto. Hereinafter, an aspect of the present disclosure in which the light-emitting element LD is an organic light-emitting diode will be described.

The light-emitting element LD outputs light corresponding to the driving current. The light-emitting element LD may output light corresponding to any one among red, green, blue, and white colors. The light-emitting element LD may be an organic light-emitting diode (OLED) or an ultra-small inorganic light-emitting diode having a size in a micro to nanoscale range, but is not limited thereto. Hereinafter, an aspect of the present disclosure in which the light-emitting element LD is an organic light-emitting diode will be described.

In addition, the structure of the pixels PXs described in the present disclosure is not interpreted as being limited to the structure of the pixel PXij described with reference to FIG. 2. According to aspects, the pixels PXs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST and the driving transistor DT are NMOS transistors, but no limitation thereto is imposed. For example, at least some or all of the transistors constituting each pixel PX may be configured as a PMOS transistor. In various aspects, each of the switching transistor ST and the driving transistor DT may be implemented as a low-temperature polycrystalline silicon (LTPS) thin-film transistor, an oxide thin-film transistor (oxide TFT), or a low-temperature polycrystalline oxide (LTPO) thin-film transistor, but is not limited thereto.

Figure 3:
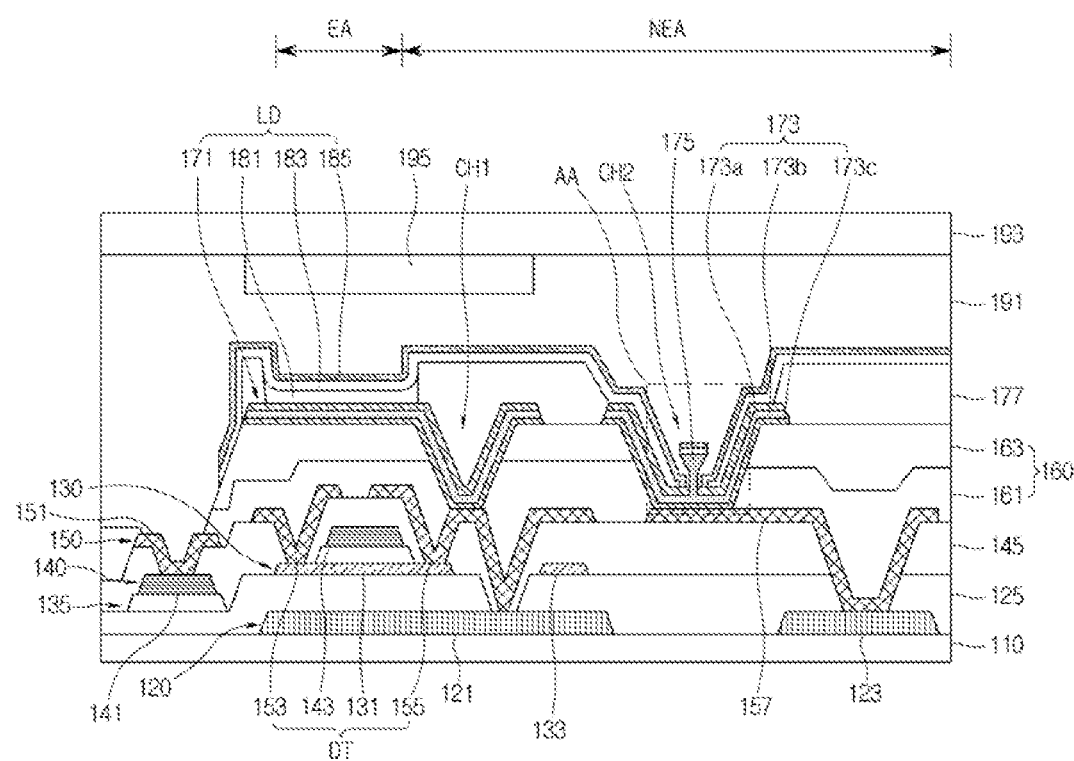
FIG. 3 is a cross-sectional view of a display panel according to aspects of the present disclosure.

FIG. 3 is a cross-sectional view of a display panel according to aspects of the present disclosure. Referring to FIGS. 1 to 3, a display panel 100 may include a substrate 110. The substrate 110 is a base member of the display panel 100, and may be a light-transmissive substrate. The substrate 110 may be a rigid substrate including glass or tempered glass, or may be a flexible substrate made of a plastic material. For example, the substrate 110 may be made of glass or a plastic material, such as polyimide (PI), polyethylene terephthalate (PET), polyethylene naphthalate (PEN), polycarbonate (PC), and the like, but the material of the substrate 110 is not limited thereto.

On the substrate 110, a first conductive layer 120 including a lower wire 121, and an auxiliary wire 123 may be placed.

The lower wire 121 may be a conductive metal having a light-blocking function. According to aspects, the lower wire 121 may protect the driving elements of the display panel 100 from external light.

The auxiliary wire 123 may be placed spaced apart from the lower wire 121. According to aspects, the auxiliary wire 123 may be connected to the power supply line through which the low-potential driving voltage ELVSS is applied. As will be described later, the low-potential driving voltage ELVSS may be transmitted to the light-emitting element LD through the auxiliary wire 123.

According to aspects, the first conductive layer 120 may have a two-layer structure including at least two metal layers, but is not limited thereto.

On the substrate 110, a buffer layer 125 may be placed. According to aspects, the buffer layer 125 may be placed on the first conductive layer 120.

The buffer layer 125 may prevent diffusion of ions or impurities from the substrate 110, and may block moisture penetration from the substrate 110.

The buffer layer 125 may be provided in a multi-layer structure including at least two layers. According to aspects, the buffer layer 125 may include layers containing: an inorganic material, such as an oxide, a nitride, and the like; an organic material; or an organic-inorganic compound. For example, the buffer layer 125 may be silicon oxide or silicon nitride.

On the buffer layer 125, an active layer 130 including an active pattern 131 and a capacitor electrode 133 may be placed.

The active pattern 131 may include a silicon-based semiconductor material or an oxide-based semiconductor material. For example, the silicon-based semiconductor material may include amorphous silicon or polycrystalline silicon. The oxide-based semiconductor material may include a quaternary metal oxide, such as an indium tin gallium zinc oxide (InSnGaZnO); a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), or a tin aluminum zinc oxide (SnAlZnO); or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), or a zinc oxide (ZnO).

The active pattern 131 may be an active area of the driving transistor DT. According to aspects, the active pattern 131 may include a drain region, a source region, and a channel region between the drain region and the source region. For example, the source region and the drain region may contain p-type or n-type impurities. Electrons or holes may flow from the source region, may pass through the channel region, and may be introduced into the drain region.

The capacitor electrode 133 may be placed so that at least a portion of the capacitor electrode 133 and the lower wire 121 overlap. Between the capacitor electrode 133 and the lower wire 121, a storage capacitor CST may be formed.

A first insulation layer 135 may be placed on the active layer 130. According to aspects, the first insulation layer 135 may be placed between the active pattern 131 and a gate electrode 143, which will be described later. For example, the first insulation layer 135 may be placed between the gate electrode 143 and the channel region of the active pattern 131.

The first insulation layer 135 may be a silicon oxide (SiOx), a silicon nitride (SiNx), or in a multi-layer structure including them.

On the first insulation layer 135, a second conductive layer 140 including a pad 141, and a gate electrode 143 may be placed. According to aspects, the gate electrode 143 may be placed at a position corresponding to the channel region of the active pattern 131.

The pad 141 may be electrically connected to at least one among the timing controller 200, the source driver 300, the gate driver 400, and the power supply circuit 500 through wires provided in a pad area of the display panel 100.

The gate electrode 143 may be made of any one or an alloy of two or more selected from a group consisting of molybdenum (Mo), aluminum (Al), chromium (Cr), gold (Au), titanium (Ti), nickel (Ni), neodymium (Nd), and copper (Cu). In addition, the gate electrode 143 may be multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). For example, the gate electrode 143 may be two layers of molybdenum and aluminum-neodymium, or molybdenum and aluminum.

The pad 141 may be made of the same material as the gate electrode 143, and may be formed through the same process as the gate electrode 143. However, aspects of the present disclosure are not limited thereto.

On the pad 141 and the gate electrode 143, a second insulation layer 145 may be placed. The second insulation layer 145 covers the pad 141 and the gate electrode 143. The second insulation layer 145 may be a silicon oxide film (SiOx), a silicon nitride film (SiNx), or multiple layers of them.

On the second insulation layer 145, a third conductive layer 150 including a pad electrode 151, a source electrode 153, a drain electrode 155, and an auxiliary electrode 157 may be placed.

The pad electrode 151 may be electrically connected to the pad 141. According to aspects, the pad electrode 151 may be in contact with the pad 141 through a contact hole penetrating through the second insulation layer 145.

Being spaced apart from each other, the source electrode 153 and the drain electrode 155 may be placed on the second insulation layer 145. The source electrode 153 and the drain electrode 155 may be connected to the source region and the drain region of the active pattern 131, respectively. According to aspects, the source electrode 153 may be connected to the source region of the active pattern 131 through a contact hole penetrating through the second insulation layer 145. The drain electrode 155 may be connected to the drain region of the active pattern 131 through a contact hole penetrating through the second insulation layer 145, and may be connected to the lower wire 121.

Although not shown, according to aspects, the source electrode 153 may be connected to a power supply wire through which driving power (for example, the high-potential driving voltage ELVDD) of the display panel 100 is supplied.

The source electrode 153 and the drain electrode 155 may be formed as a single layer or multiple layers composed of any one or an alloy of two or more selected from a group consisting of molybdenum (Mo), aluminum (Al), chromium (Cr), gold (Au), titanium (Ti), nickel (Ni), neodymium (Nd), and copper (Cu). In the case where the source electrode 153 and the drain electrode 155 are multiple layers, they may be composed of two layers of molybdenum and aluminum-neodymium, or three layers of titanium and aluminum and titanium; molybdenum and aluminum and molybdenum; or molybdenum and aluminum-neodymium and molybdenum. In the meantime, FIG. 3 shows that the source electrode 153 and the drain electrode 155 have a two-layer structure, but aspects of the present disclosure are not limited thereto.

The active pattern 131, the gate electrode 143, the source electrode 153, and the drain electrode 155 may constitute a transistor. According to aspects, the transistor may be, for example, the driving transistor DT or the switching transistor ST. FIG. 3 shows an example that the active pattern 131, the gate electrode 143, the source electrode 153, and the drain electrode 155 constitute the driving transistor DT, but no limitation thereto is imposed.

In the meantime, FIG. 3 shows, as an example, an inverted staggered transistor (DT) of which the source electrode 153 and the drain electrode 155 are placed above the gate electrode 143, but aspects of the present disclosure are not limited thereto. For example, the gate electrode 143, the source electrode 153, and the drain electrode 155 may be placed on one layer.

The auxiliary electrode 157 may be electrically connected to the auxiliary wire 123. According to aspects, the auxiliary electrode 157 may be in contact with the auxiliary wire 123 through a contact whole penetrating through the second insulation layer 145. The auxiliary electrode 157 may be made of the same material as the source electrode 153 and the drain electrode 155, and may be formed as a single layer or multiple layers.

According to aspects, the auxiliary electrode 157 may be placed in such a manner as to have a slope. That is, the auxiliary electrode 157 may include a first portion placed on the auxiliary wire 123, and a second portion placed on the auxiliary wire 123 and the second insulation layer 145. The first portion and the second portion may be at an angle to each other.

On the third conductive layer 150, a protective layer 160 may be placed. The protective layer 160 may cover the third conductive layer 150. The protective layer 160 may be a layer including at least one among an organic film and an inorganic film having an insulation function, a planarizing function, or a waterproofing function.

The protective layer 160 may include a first protective layer 161, and a second protective layer 163 placed on the first protective layer 161. The first protective layer 161 may insulate the third conductive layer 150. According to aspects, the first protective layer 161 may include a silicon oxide film (SiOx), a silicon nitride film (SiNx), and multiple films including them. For example, the first protective layer 161 may be a passivation layer.

According to aspects, the first protective layer 161 may include multiple layers, and an additional conductive layer may be further formed between the multiple layers included in the first protective layer 161. The conductive layer formed in the first protective layer 161 may further include electrodes of circuit elements and driving lines, for example, an auxiliary gate electrode of the transistors DT and ST, an upper electrode of the storage capacitor CST, and the like. For example, the first protective layer 161 may be a passivation layer.

The second protective layer 163 may be placed on the first protective layer 161. The second protective layer 163 may be a planarizing film for reducing the difference in level between the layers under the second protective layer 163. According to aspects, the second protective layer 163 may include an organic material such as polyimide, benzocyclobutene series resin, acrylate, and the like. For example, the second protective layer 163 may be an overcoat layer.

According to aspects, any one among the first protective layer 161 and the second protective layer 163 may be omitted. In this case, the protective layer 160 may be formed with only the one layer except the omitted layer.

A first contact hole CH1 may be formed in the protective layer 160. According to aspects, the first contact hole CH1 may be formed penetrating through the first protective layer 161 and the second protective layer 163, and may expose at least a portion of the protective layer 160 and the drain electrode 155.

A second contact hole CH2 may be formed in the protective layer 160. According to aspects, the second contact hole CH2 may be formed penetrating through the first protective layer 161 and the second protective layer 163, and may expose at least a portion of the protective layer 160 and the auxiliary electrode 157.

On the protective layer 160, an anode electrode 171 and a connection electrode 173 may be placed.

The anode electrode 171 may be connected to the drain electrode 155 through the first contact hole CH1. A signal transmitted from the drain region of the active pattern 131 may pass through the drain electrode 155, and may be transmitted to the lower wire 121. In addition, the signal may be transmitted from the drain electrode 155 to the anode electrode 171.

In addition, the anode electrode 171 may be electrically connected to a light-emitting material layer 181 thereon, and may provide holes to the light-emitting material layer 181.

According to aspects, the anode electrode 171 may be a transmissive electrode that transmits the light output from the light-emitting material layer 181, or may be a reflective electrode that reflects the light. For example, in the case where the display panel 100 is a bottom emission type, the anode electrode 171 may be a transmissive electrode, and in the case where the display panel 100 is a top emission type, the anode electrode 171 may be a reflective electrode. In addition, in the case where the display panel 100 is a dual emission type, the anode electrode 171 may be a transmissive electrode. Hereinafter, a description will be given assuming that the display panel 100 is a top emission type.

The anode electrode 171 may be made of a transparent conductive material, such as indium tin oxide (ITO), indium zinc oxide (IZO), zinc oxide (ZnO), or the like. In addition, the anode electrode 171 may include a reflective layer including a metal material, such as aluminum (Al), copper (Cu), silver (Ag) and nickel (Ni), or an alloy thereof. According to aspects, the anode electrode 171 may be composed of three layers that are a transparent conductive layer, a reflective layer, and a transparent conductive layer stacked in that order. For example, the anode electrode 171 may be composed of three layers including ITO, Ag, and ITO in that order.

The connection electrode 173 may be connected to the auxiliary electrode 157 through the second contact hole CH2. The low-potential driving voltage ELVSS transmitted from the auxiliary electrode 157 may be transmitted to the connection electrode 173.

The connection electrode 173 may be placed spaced apart from the anode electrode 171, and may be electrically connected to the anode electrode 171. According to aspects, the connection electrode 173 may be placed in a non-emission area NEA.

The connection electrode 173 may be made of a transparent conductive material, such as indium tin oxide (ITO), indium zinc oxide (IZO), zinc oxide (ZnO), or the like. In addition, the connection electrode 173 may include a reflective layer including a metal material, such as aluminum (Al), copper (Cu), silver (Ag), nickel (Ni), or an alloy thereof. According to aspects, similarly to the anode electrode 171, the connection electrode 173 may be composed of three layers including ITO, Ag, and ITO in that order.

According to aspects, the connection electrode 173 may include a first electrode 173*a*, a second electrode 173*b* placed under the first electrode 173*a*, and a third electrode 173*c* placed under the second electrode 173*b* and being in contact with the auxiliary electrode 157. The first electrode 173*a* to the third electrode 173*c* may be electrically connected to each other.

For example, the first electrode 173*a* and the third electrode 173*c* may include a transparent conductive material, and the second electrode 173*b* may include a metal.

According to aspects of the present disclosure, the display panel 100 may include a protrusion 175 extending from the connection electrode 173. The protrusion 175 may be formed protruding from a surface of the connection electrode 173. According to aspects, the protrusion 175 may be formed protruding from the surface, among the surfaces of the connection electrode 173, opposite to the surface that is in contact with the auxiliary electrode 157.

As will be described later, due to the protrusion 175 protruding from the connection electrode 173, a portion of the connection electrode 173 is not covered by an electron auxiliary layer 183, and may thus be in direct contact with a cathode electrode 185.

On the protective layer 160, a partition wall 177 may be placed. The partition wall 177 may define an emission area EA of a pixel PX. The partition wall 177 may include an opening that exposes at least a portion of the anode electrode 171, and may be formed in such a manner as to cover the remaining portion (for example, an edge) of the anode electrode 171 which is not exposed. The exposed portion of the anode electrode 171 may be defined as the emission area EA of the pixel PX.

According to aspects, the partition wall 177 may further include an opening that exposes a portion of the protective layer 160. That is, the partition wall 177 may be placed on a portion of the protective layer 160 rather than the whole protective layer 160.

The partition wall 177 may be made of a material (for example, a colored material) capable of blocking light. Accordingly, light does not pass through the layers except the opening of the partition wall 177, but light passes only through the opening of the partition wall 177.

The partition wall 177 may include an organic material such as polyimide, benzocyclobutene series resin, acrylate, and the like. In addition, the partition wall 177 may include an inorganic material including silicon oxide, and silicon nitride. According to aspects, the partition wall 177 may be in a multi-layer structure including an organic material and an inorganic material.

On the anode electrode 171, the light-emitting material layer 181 may be placed. According to aspects, the light-emitting material layer 181 may be placed on a portion in which the anode electrode 171 is exposed, between the partitions walls 177. For example, the light-emitting material layer 181 may be placed on the anode electrode 171, and may be surrounded by the partition wall 177.

According to aspects, the partition wall 177 may be formed in such a manner as to be higher than the light-emitting material layer 181.

The light-emitting material layer 181 may output light in response to an electrical signal transmitted from the anode electrode 171. According to aspects, the light output from the light-emitting material layer 181 may be any one among red light, green light, blue light, and white light, but aspects of the present disclosure are not limited thereto. For example, the color of the light output from the light-emitting material layer 181 may be one among magenta, cyan, and yellow colors.

The light-emitting material layer 181 may be formed through an inkjet process of applying a solution containing an organic material onto a substrate, but aspects of the present disclosure are not limited thereto. For example, the light-emitting material layer 181 may also be formed by a deposition process or a laser transfer process. According to aspects, in the case where the light-emitting material layer 181 is formed through the inkjet process, a surface of the light-emitting material layer 181 may be a curved surface. For example, the top surface of the light-emitting material layer 181 may have a concave or convex shape.

On the light-emitting material layer 181, the electron auxiliary layer 183 and the cathode electrode 185 may be placed. The cathode electrode 185 may provide electrons to the light-emitting material layer 181, and the electron auxiliary layer 183 may smoothly transmit the electrons discharged from the cathode electrode 185, to the light-emitting material layer 181. The light-emitting element LD may include the light-emitting material layer 181, the electron auxiliary layer 183, and the cathode electrode 185.

The electron auxiliary layer 183 may be placed along a surface of the light-emitting material layer 181, and the cathode electrode 185 may be placed along a surface of the electron auxiliary layer 183.

According to aspects, the electron auxiliary layer 183 may include at least one among an electron injection layer (EIL), and an electron transport layer (ETL). The electrons discharged from the cathode electrode 185 are injected into the electron injection layer (EIL). The electron transport layer (ETL) transports the injected electrons to the light-emitting material layer 181.

The electron auxiliary layer 183 may be placed in such a manner as to cover the light-emitting material layer 181. According to aspects, the electron auxiliary layer 183 may be placed along the surfaces of the light-emitting material layer 181, the partition wall 177, and the protective layer 160.

According to aspects of the present disclosure, the electron auxiliary layer 183 may be placed on the connection electrode 173, but may be discontinuous on the connection electrode 173. According to aspects, the electron auxiliary layer 183 may include two parts spaced apart from each other on the connection electrode 173. Since the protrusion 175 is formed protruding from the connection electrode 173, the electron auxiliary layer 183 may be divided on the connection electrode 173 by the protrusion 175. In other words, a portion of the connection electrode 173 may not be completely covered by the electron auxiliary layer 183, and may be exposed between the two parts of the electron auxiliary layer 183 spaced apart from each other.

According to aspects, a portion of the electron auxiliary layer 183 may be placed on the protrusion 175.

According to aspects, the cathode electrode 185 may function as a cathode (positive) electrode. For example, the cathode electrode 185 may include a transparent conductive material (TCO) capable of transmitting light, or a semi-transmissive conductive material including molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof.

The cathode electrode 185 may be placed on the electron auxiliary layer 183. According to aspects, the cathode electrode 185 may be placed above the connection electrode 173 in such a manner as to cover the electron auxiliary layer 183.

According to aspects of the present disclosure, the cathode electrode 185 may be in contact with the connection electrode 173. According to aspects, the cathode electrode 185 may be in contact with the connection electrode 173 within the second contact hole CH2. As described above, the electron auxiliary layer 183 may include the two parts spaced apart from each other on the connection electrode 173, and the cathode electrode 185 may be placed in such a manner as to cover the two parts of the electron auxiliary layer 183 spaced apart from each other. Accordingly, the cathode electrode 185 may be in direct contact with the connection electrode 173. That is, the cathode electrode 185 may be in direct contact with an exposed portion of the connection electrode 173 between the two parts of the electron auxiliary layer 183 spaced apart from each other.

With the above-described connection structure, the cathode electrode 185 may receive power from the auxiliary wire 123 through the auxiliary electrode 157 and the connection electrode 173. For example, the low-potential driving voltage ELVSS supplied through the auxiliary wire 133 may be supplied to the cathode electrode 185.

According to aspects, a portion of the cathode electrode 185 may be placed on the electron auxiliary layer 183 positioned on the protrusion 175.

According to aspects of the present disclosure, since the cathode electrode 185 may be connected to the auxiliary wire 123 through the auxiliary electrode 157, the power supplied through the auxiliary wire 123 is supplied stably to the cathode electrode 185, whereby the driving characteristics of the light-emitting element LD may be enhanced.

According to aspects, in the light-emitting element LD, a hole injection layer (HIL) into which holes are injected from the anode electrode 171, and a hole transport layer (HTL) placed on the hole injection layer and helping the injected holes to move may be further placed between the light-emitting material layer 181 and the anode electrode 171.

An encapsulation layer 191 may be placed on the cathode electrode 185. The encapsulation layer 191 may prevent oxygen, moisture, or foreign matter from penetrating into a layer (for example, the cathode electrode 185 and lower layers) under the encapsulation layer 191. According to aspects, the encapsulation layer 191 may be formed in a multi-layer structure including at least one inorganic layer and at least one organic layer. For example, the encapsulation layer 191 may be in a multi-layer structure in which an inorganic layer, an organic layer, and an inorganic layer are stacked in that order.

According to aspects, the organic layer may be thicker than the inorganic layer so as to prevent foreign matter from penetrating into the cathode electrode 185 and the lower layers. In addition, the organic layer may be made of a transparent material capable of transmitting light output from the light-emitting material layer 181, but is not limited thereto.

The inorganic layer may include at least one among a silicon nitride, an aluminum nitride, a zirconium nitride, a titanium nitride, a hafnium nitride, a tantalum nitride, a silicon oxide, an aluminum oxide, and a titanium oxide. The organic layer may include at least one among an acrylic resin, an epoxy resin, a phenolic resin, a polyamide resin, a benzocyclobutene resin, and a polyimide resin.

On the encapsulation layer 191, an upper substrate 193 may be formed. The upper substrate 193 may be made of the same material as the substrate 110. The upper substrate 193 may be attached on the encapsulation layer 191 through an adhesive, or the like. However, the bonding method of the upper substrate 193 is not limited thereto.

In various aspects, between the encapsulation layer 191 and the upper substrate 193, a color filter 195 may be further formed. The color filter 195 may be placed in the emission area EA. The color filter 195 is a wavelength-selective optical filter that selectively transmits only a partial wavelength band of incident light by transmitting light in a particular wavelength band and blocking light in other particular wavelength bands. The color filter 195 may be made of a photosensitive resin containing a colorant, such as a pigment, a dye, or the like. The light that is output from the light-emitting element LD and passes through the color filter 195 may have any one among red, green, and blue colors. In the case where the light-emitting element LD outputs white light, the color filter 195 for white light may be omitted.

Figure 4:
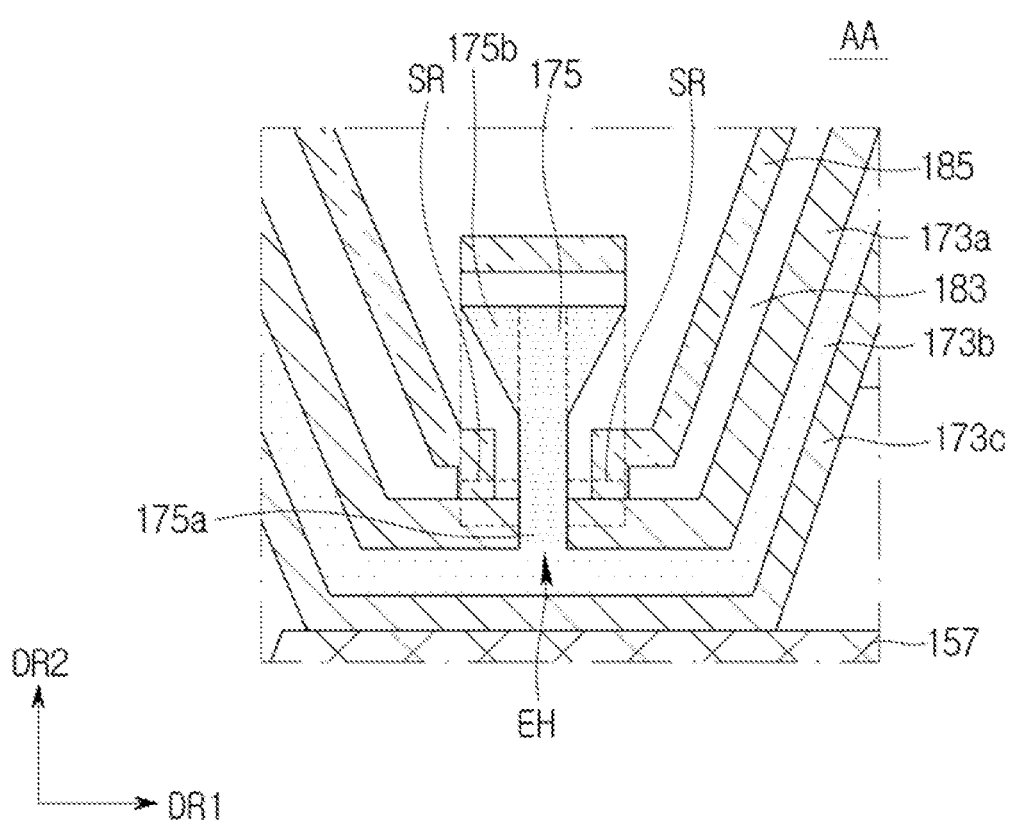
FIG. 4 is an enlarged view of portion AA shown in FIG. 3.

FIG. 4 is an enlarged view of portion AA shown in FIG. 3. Referring to FIGS. 1 to 4, the connection electrode 173 may be placed on the auxiliary electrode 157. According to aspects, the connection electrode 173 may be placed on the auxiliary electrode 157 in a first direction. The first direction DR1 may be a horizontal direction, but is not limited thereto.

In the connection electrode 173, an exposure hole EH formed in the first electrode 173*a* may be placed. The exposure hole EH may penetrate through a portion of the first electrode 173*a* and may thus expose the second electrode 173*b*.

The protrusion 175 may extend from the second electrode 173*b* and may protrude through the exposure hole EH. According to aspects, the protrusion 175 may extend from the second electrode 173*b* in a second direction DR2, and may be formed protruding through the exposure hole EH which is a space (gap) in the first electrode 173*a*. For example, the second direction may be a vertical direction, but is not limited thereto. The second direction may be any direction that intersects the first direction DR1.

According to aspects of the present disclosure, the protrusion 175 may form a shade region SR on the connection electrode 173.

The protrusion 175 may have a portion protruding from the connection electrode 173 and extending in the first direction DR1 in which the connection electrode 173 is placed. Because of this portion, the shade region SR shaded by the protrusion 175 may be formed on the connection electrode 173.

In the present disclosure, the protrusion 175 may be described likened to a tree. According to aspects, the protrusion 175 may have a trunk 175*a* placed in the first electrode 173*a* and protruding from the second electrode 173*b*; and a crown 175*b* extending from the trunk 175*a* and having a portion extending in the first direction DR1. The crown 175*b* may have the portion extending in the direction (for example, the first direction DR1) in which the connection electrode 173 is placed. Because of this portion, the shade region SR may be formed on the connection electrode 173.

As will be described later, in the case where the electron auxiliary layer 183 is deposited on the connection electrode 173, the shade region SR may refer to a region in which the electron auxiliary layer 183 is not deposited due to the protrusion 175. That is, in the shade region SR, the electron auxiliary layer 183 may not be deposited and the first electrode 173*a* may be exposed.

The electron auxiliary layer 183 may be placed on the connection electrode 173. According to aspects, the electron auxiliary layer 183 may be placed in a region on the connection electrode 173 except the shade region SR. For example, the electron auxiliary layer 183 may be placed in such a manner as not to overlap the shade region SR.

In addition, the electron auxiliary layer 183 may be placed on the protrusion 175. For example, the electron auxiliary layer 183 may be placed on the top surface of the crown 175*b* of the protrusion 175.

The cathode electrode 185 may be placed on the connection electrode 173, and may be placed in such a manner as to cover the electron auxiliary layer 183. In addition, the cathode electrode 185 may be placed in the shade region SR, and may be in contact with the first electrode 173*a* in the shade region SR. As described above, the first electrode 173*a* of the connection electrode 173 in the shade region SR is exposed without being covered by the electron auxiliary layer 183, so that the cathode electrode 185 may be in direct contact with the first electrode 173*a* and may receive the low-potential driving voltage ELVSS transmitted from the auxiliary electrode 157.

In addition, the cathode electrode 185 may be placed on the electron auxiliary layer 183 positioned on the protrusion 175.

According to aspects of the present disclosure, since the cathode electrode 185 may be connected to the auxiliary wire 123 through the auxiliary electrode 157, the power supplied through the auxiliary wire 123 is supplied stably to the cathode electrode 185, whereby the operating characteristics of the light-emitting element LD may be enhanced.

FIGS. 5 to 24 are diagrams showing a method of manufacturing a display panel according to aspects of the present disclosure. Hereinafter, a method of manufacturing a display panel 100 will be described with reference to FIGS. 1 to 24.

Figure 5:
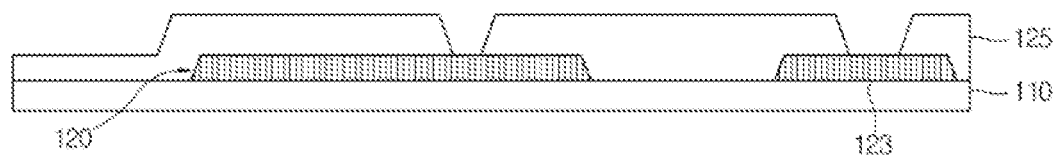
FIGS. 5 to 27 are diagrams showing a manufacturing process of a display panel according to the present disclosure.

Referring to FIG. 5, the substrate 110 may be provided, and on the substrate 110, the first conductive layer 120 may be formed. The first conductive layer 120 may include the lower wire 121, and the auxiliary wire 123. As shown in FIG. 5, the first conductive layer 120 may be provided in a multi-layer structure including at least two metal layers, but aspects of the present disclosure are not limited thereto.

The first conductive layer 120 may be formed through a patterning process. According to aspects, the lower wire 121 and the auxiliary wire 123 may be formed by applying (or depositing) a metal material on the substrate 110 and then performing patterning with use of a mask, but no limitation thereto is imposed.

On the first conductive layer 120, the buffer layer 125 may be formed. The buffer layer 125 may be formed by a deposition process.

Figure 6:
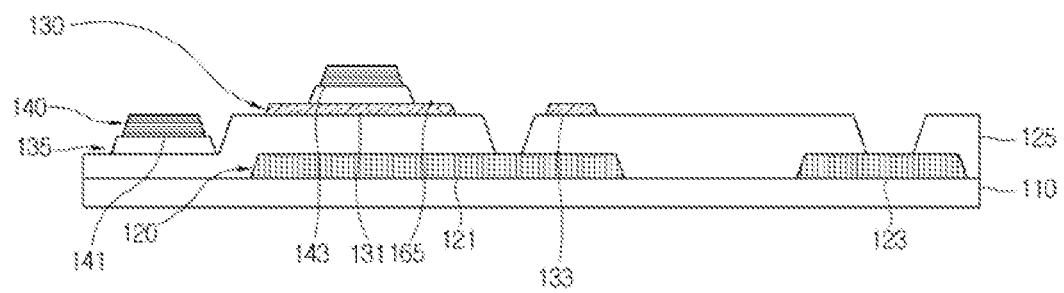

Referring to FIG. 6, on the buffer layer 125, the active layer 130 including the active pattern 131 and the storage electrode 133 may be formed. According to aspects, the oxide-based semiconductor material or the silicon-based semiconductor material may be applied on the buffer layer 125, and patterning may be performed by using a mask, thereby forming the active pattern 131.

According to aspects, the source region and the drain region of the active pattern 131 may be formed by performing heat treatment or ion implantation on the oxide-based semiconductor material or the silicon-based semiconductor material, but no limitation thereto is imposed.

On the buffer layer 125, the first insulation layer 135 may be formed. According to aspects, the first insulation layer 135 may be placed in such a manner as to cover the buffer layer 125 and the active layer 130. According to aspects, the first insulation layer 135 may be formed selectively in an area in which the pad 141 and the gate electrode 143 are to be placed. For example, an inorganic layer including a silicon oxide (SiOx) or a silicon nitride (SiNx) may be formed on the buffer layer 125 and the active layer 130, and then the inorganic layer may be selectively subjected to patterning, thereby forming the first insulation layer 135.

On the first insulation layer 135, the second conductive layer 140 including the pad 141, and the gate electrode 143 may be formed. According to aspects, a conductive material may be applied on the first insulation layer 135, and then the applied conductive material may be subjected to patterning, thereby forming the pad 141 and the gate electrode 143.

Figure 7:
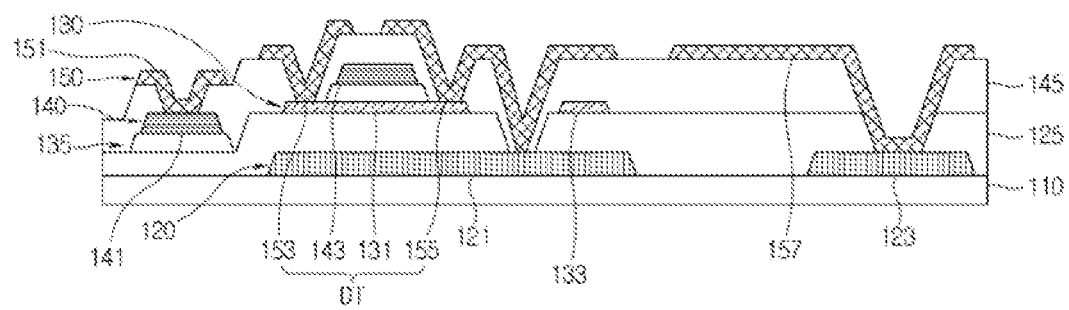

Referring to FIG. 7, the second insulation layer 145 may be formed on the first insulation layer 135 and the second conductive layer 140. The second insulation layer 145 may be formed to cover both the first insulation layer 135 and the second conductive layer 140. According to aspects, the second insulation layer 145 may be formed by a deposition process.

On the second insulation layer 145, the third conductive layer 150 including the pad electrode 151, the source electrode 153, the drain electrode 155, and the auxiliary electrode 157 may be formed. According to aspects, by selectively performing patterning on the second insulation layer 145, contact holes exposing the pad 141, the active pattern 131, the lower wire 121, and the auxiliary wire 123, respectively, are formed, and the pad electrode 151, the source electrode 153, the drain electrode 155, and the auxiliary electrode 157 may be formed in the respective contact holes.

The source electrode 153, the gate electrode 143, the active pattern 131, and the drain electrode 155 may constitute the driving transistor DT.

Accordingly, the pad electrode 151 may be in contact with the pad 141. The source electrode 153 may be in contact with the source region of the active pattern 131. The drain electrode 155 may be in contact with the drain region of the active pattern 131 and the lower wire 121. The auxiliary electrode 157 may be in contact with the auxiliary wire 123.

Figure 8:
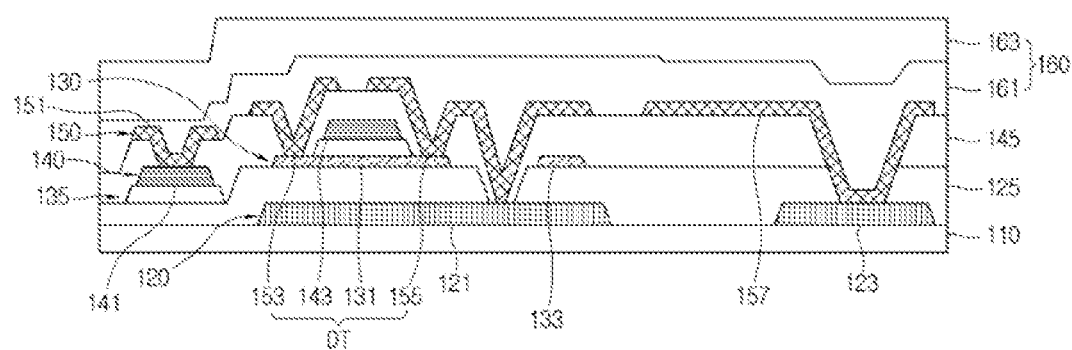

Referring to FIG. 8, the protective layer 160 may be formed on the second insulation layer 145 and the third conductive layer 150. The protective layer 160 may be formed to cover both the second insulation layer 145 and the third conductive layer 150. According to aspects, after the first protective layer 161 is formed, the second protective layer 163 may be formed on the first protective layer 161. For example, the protective layer 160 may be formed by a deposition process.

Figure 9:
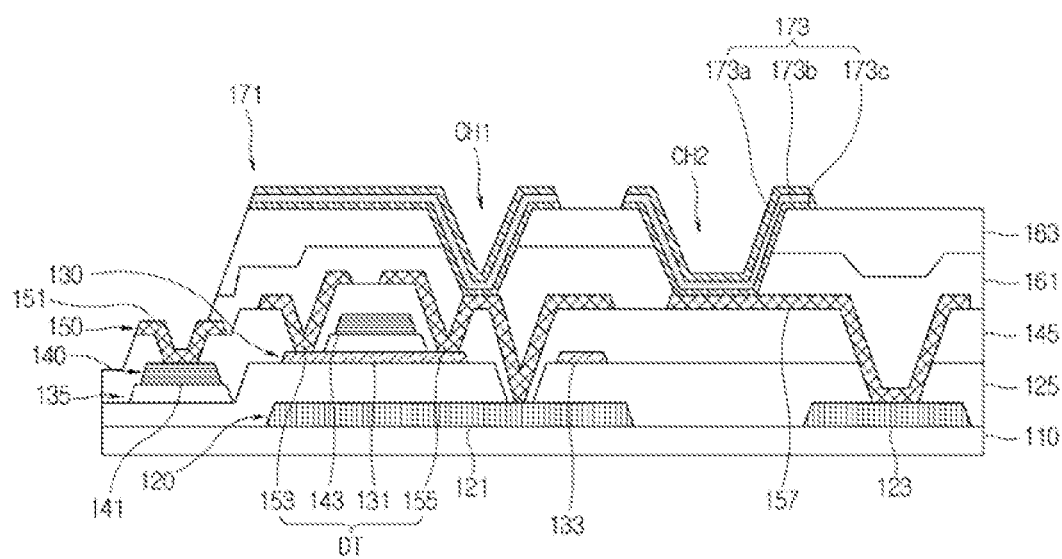

Referring to FIG. 9, in the protective layer 160, the contact holes CH1 and CH2 penetrating through the protective layer 160 may be formed. According to aspects, the contact holes CH1 and CH2 may be formed by etching the protective layer 160.

The first contact hole CH1 may be formed by etching the protective layer 160 so that at least a portion of the drain electrode 155 is exposed. The second contact hole CH2 may be formed by etching the protective layer 160 so that at least a portion of the auxiliary electrode 157 is exposed.

The anode electrode 171 may be formed on the protective layer 160. According to aspects, the anode electrode 171 may be formed in such a manner that at least a portion of the anode electrode 171 is placed along the first contact hole CH1. Accordingly, the anode electrode 171 may be in contact with the drain electrode 155 exposed through the first contact hole CH1.

According to aspects, the anode electrode 171 may be formed by performing patterning on three layers that are a transparent conductive layer, a reflective layer, and a transparent conductive layer stacked in that order. For example, the anode electrode 171 may be composed of three layers including ITO, Ag, and ITO in that order.

The connection electrode 173 may be formed on the protective layer 160, being spaced apart from the anode electrode 171. According to aspects, the connection electrode 173 may be formed in such a manner that at least a portion of the connection electrode 173 is placed along the second contact hole CH2. Accordingly, the low-potential driving voltage ELVSS transmitted from the auxiliary electrode 157 may be transmitted to the connection electrode 173.

According to aspects, regarding to the connection electrode 173, by performing patterning on three layers that are a transparent conductive material layer, a metal layer, and a transparent conductive material layer stacked in that order, the first electrode 173a, the second electrode 173b, and the third electrode 173c of the connection electrode 173 may be formed.

For example, the anode electrode 171 and the connection electrode 173 may be formed together in the same process, but no limitation thereto is imposed.

Figure 10:
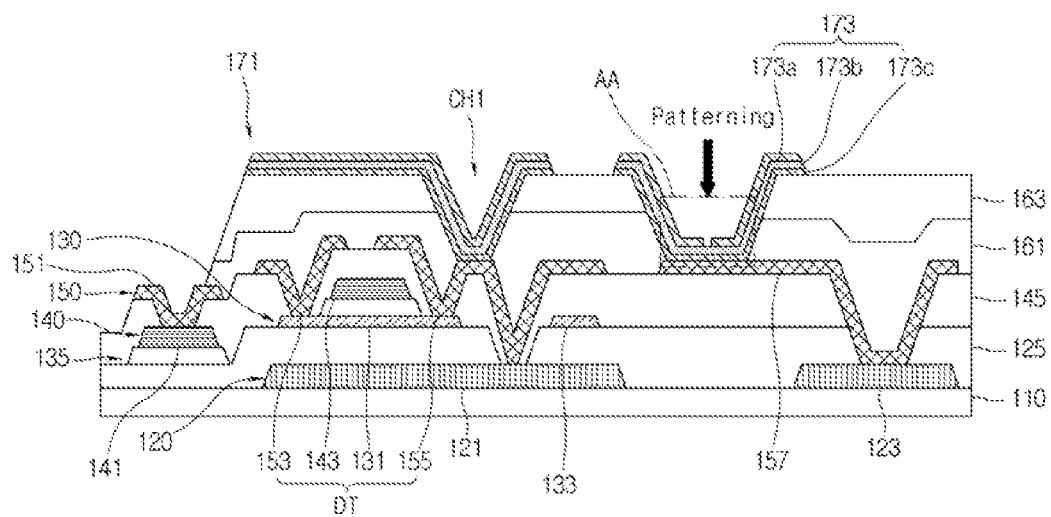
Figure 11:
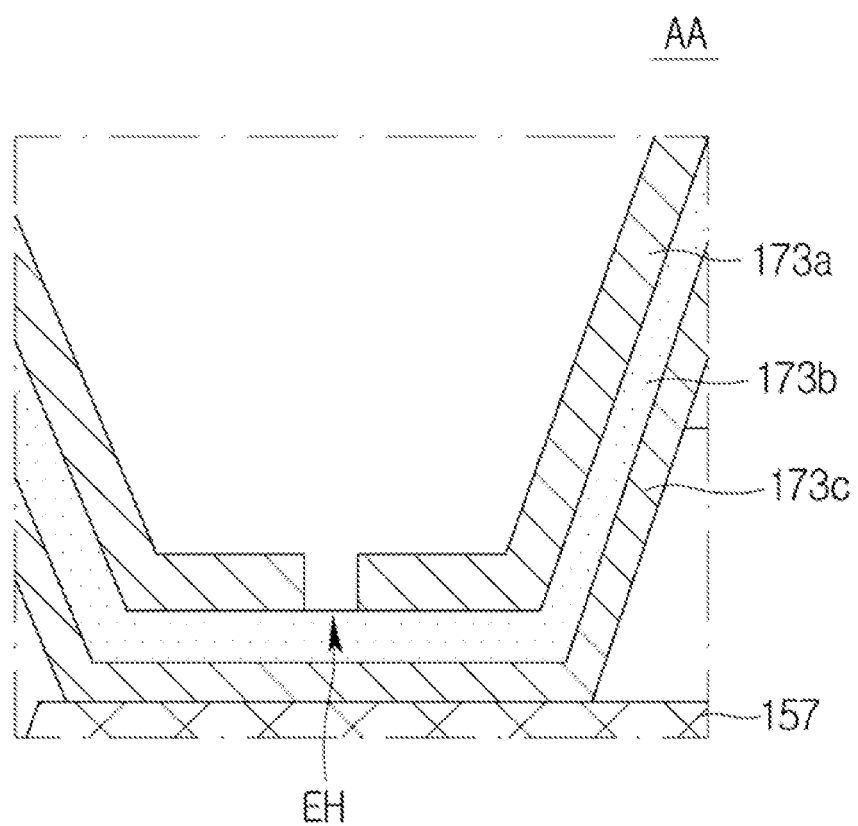

Referring to FIGS. 10 and 11, the upper portion of the connection electrode 173 is subjected to patterning. According to aspects, a portion of the first electrode 173a of the connection electrode 173 may be subjected to patterning, and the exposure hole EH may be formed in the first electrode 173a. Through the exposure hole EH, a portion of the second electrode 173b may be exposed.

According to aspects, the exposure hole EH may be formed by performing lithography or laser transfer on a portion of the first electrode 173a. In the meantime, multiple exposure holes EHs may be provided.

Figure 12:
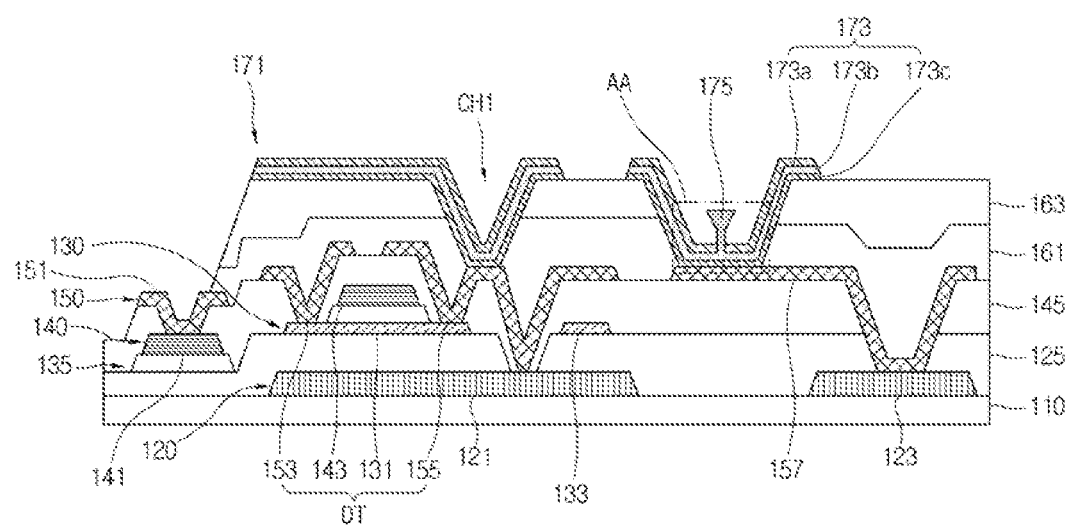
Figure 13:
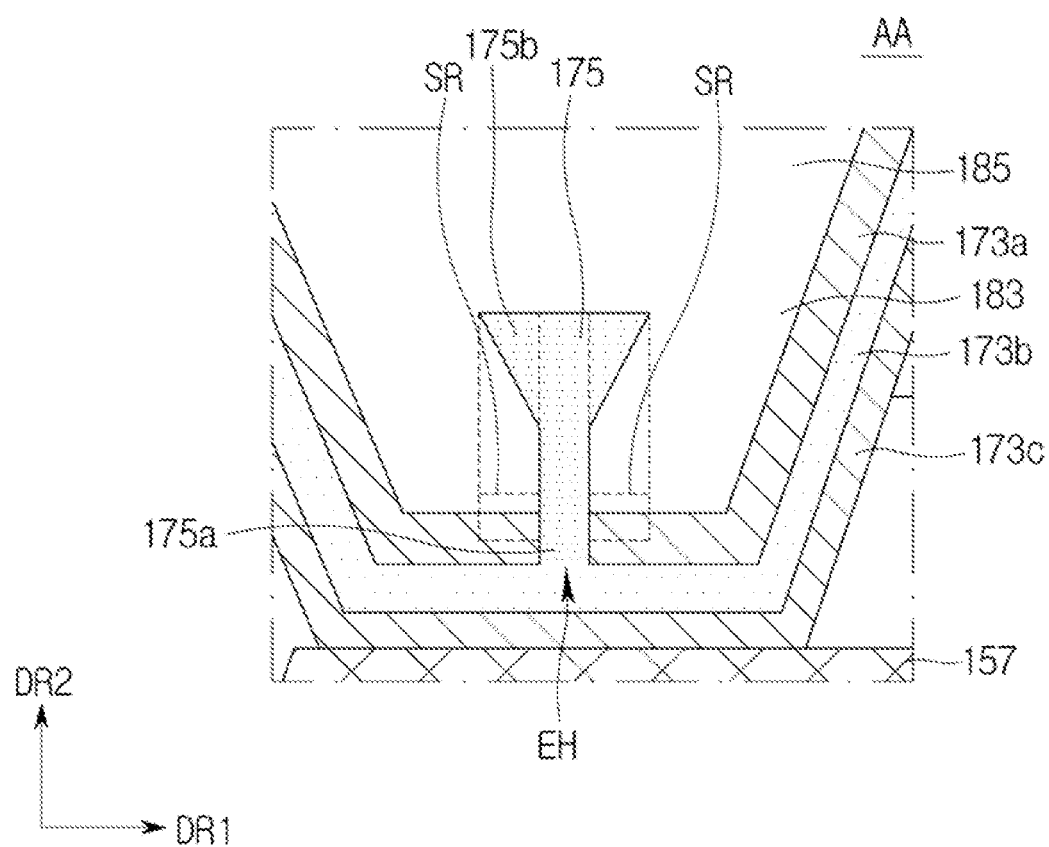
Figure 14:
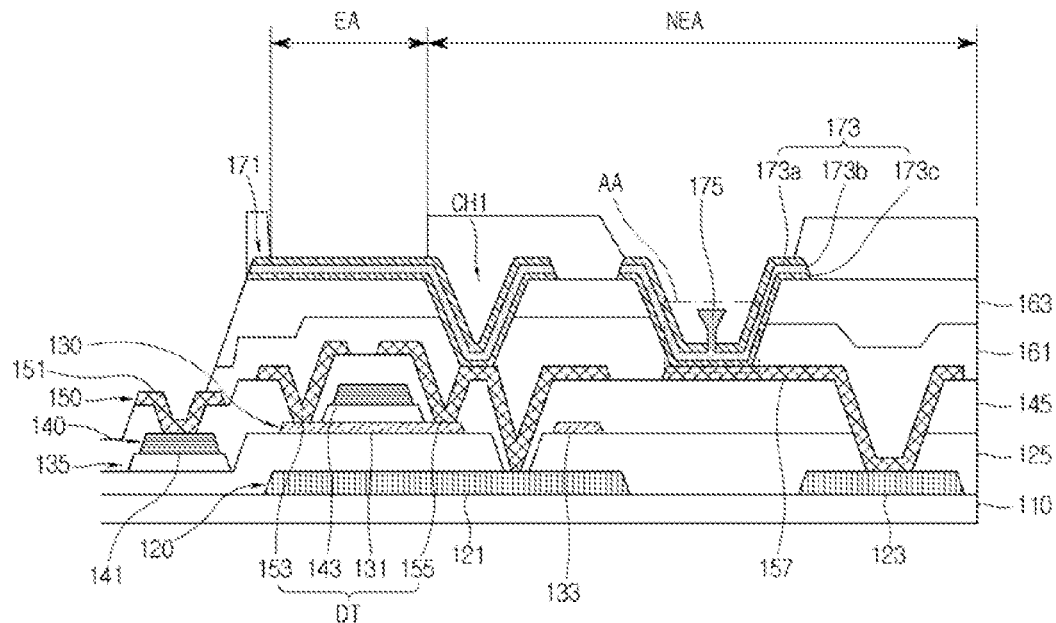

Referring to FIGS. 12 to 14, the protrusion 175 may be formed protruding from the connection electrode 173. According to aspects, the protrusion 175 may be formed protruding from the second electrode 173b exposed through the exposure hole EH.

According to aspects, while the second electrode 173b is exposed through the exposure hole EH, the substrate 110 is exposed to room temperature, treated with high temperature, or ozone (O3) or hydrogen sulfide (H2S), so that an ionic reaction may occur at the exposed second electrode 173b. Due to the ionic reaction, the protrusion 175 may be formed protruding from the second electrode 173b. For example, in the case where the second electrode 173b contains silver (Ag), the silver (Ag) exposed by the exposure hole EH may react with hydrogen sulfide (H2S) and grow, thereby forming the protrusion 175. From the grown silver (Ag), the trunk 175a of the protrusion 175 may be formed first, and the crown 175b may be further formed from the trunk 175a.

The protrusion 175 may be formed in such a manner as to be irregular. According to aspects, the trunk 175a may be formed in the second direction DR2 from the exposure hole EH, and the crown 175b may extend from the trunk 175a and may have a portion formed in the first direction DR1. For example, at least the portion of the crown 175b may be in a reverse-tapered shape.

By the shape of the protrusion 175 (for example, the shape of the crown 175b), the shade region SR may be formed on the connection electrode 173. According to aspects, by the crown 175b of the protrusion 175, the shade region SR may be formed on the first electrode 173a of the connection electrode 173.

Referring to FIG. 14, the partition wall 177 may be formed on the anode electrode 171. According to aspects, the partition wall 177 may be formed on the anode electrode 171 in such a manner as to expose a portion of the anode electrode 171 and cover the remaining portion. In addition, the partition wall 177 may be formed in the second contact hole 157 in such a manner as to expose a portion of the auxiliary electrode 147 and cover the remaining portion.

According to aspects, the partition wall 177 may not be placed in the second contact hole CH2. That is, the partition wall 177 may expose the second contact hole CH2.

An organic material or inorganic material may be applied on the protective layer 160, and patterning may be selectively performed by using a mask, thereby forming the partition wall 177. Herein, through the patterning process, an opening exposing at least a portion of the anode electrode 171 and the second contact hole CH2 may be formed.

According to aspects, at least a portion of the surface of the partition wall 177 may be hydrophobic. For example, the partition wall 177 may be formed through a photolithography process after applying a solution that is a mixture of an organic insulation material and a hydrophobic material such as fluorine (F). Due the light emitted during the photolithography process, a hydrophobic material, such as fluorine, may move to the top of the partition wall 177, and accordingly, the top surface of the partition wall 177 has a hydrophobic property and the remaining portion may have a hydrophilic property. However, the present aspects are not limited thereto. The whole portion of the partition wall 177 may be hydrophobic.

Figure 15:
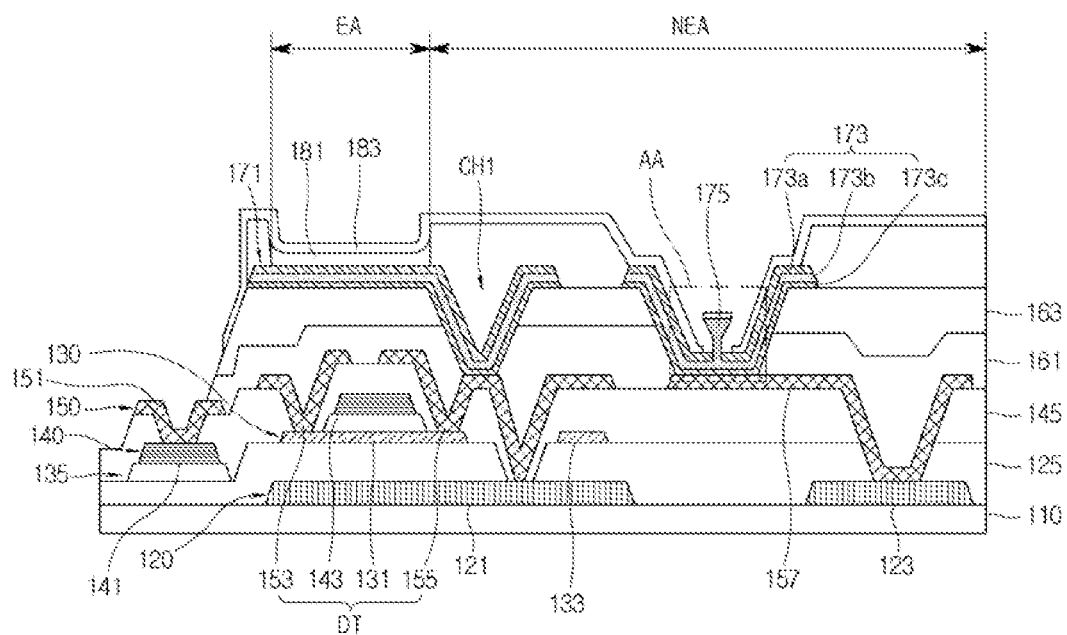

Referring to FIG. 15, the light-emitting material layer 181 and the electron auxiliary layer 183 may be formed. The light-emitting material layer 181 may be formed by depositing an organic material (a deposition process), applying a solution containing an organic material (an inkjet process), or irradiating a film containing an organic material with a laser (a laser transfer process), but aspects of the present disclosure are not limited thereto. However, the present disclosure is described assuming that the light-emitting material layer 181 is formed through the inkjet process.

The light-emitting material layer 181 may be formed on the exposed anode electrode 171, in the emission area EA surrounded by the partition wall 177. By the partition wall 177, the light-emitting material layer 181 may be prevented from overflowing to the outside of the emission area EA.

According to aspects, when the light-emitting material layer 181 is formed through the inkjet process, there may be a difference in height between the central area of the light-emitting material layer 181 and the edge area (adjacent to the partition wall 177), due to the force between the light-emitting material layer 181 and the partition wall 177. For example, the top surface of the light-emitting material layer 181 may be thinnest at the central portion and may be thickest at the edge, but aspects of the present disclosure are not limited thereto.

The electron auxiliary layer 183 may be formed on the light-emitting material layer 181. According to aspects, the electron auxiliary layer 183 may be formed by a deposition process. For example, the electron auxiliary layer 183 may be deposited by vertical deposition, but no limitation thereto is imposed.

The electron auxiliary layer 183 may be deposited on the surface in such a manner as to cover the light-emitting material layer 181, the partition wall 177, and the protective layer 160.

Figure 16:
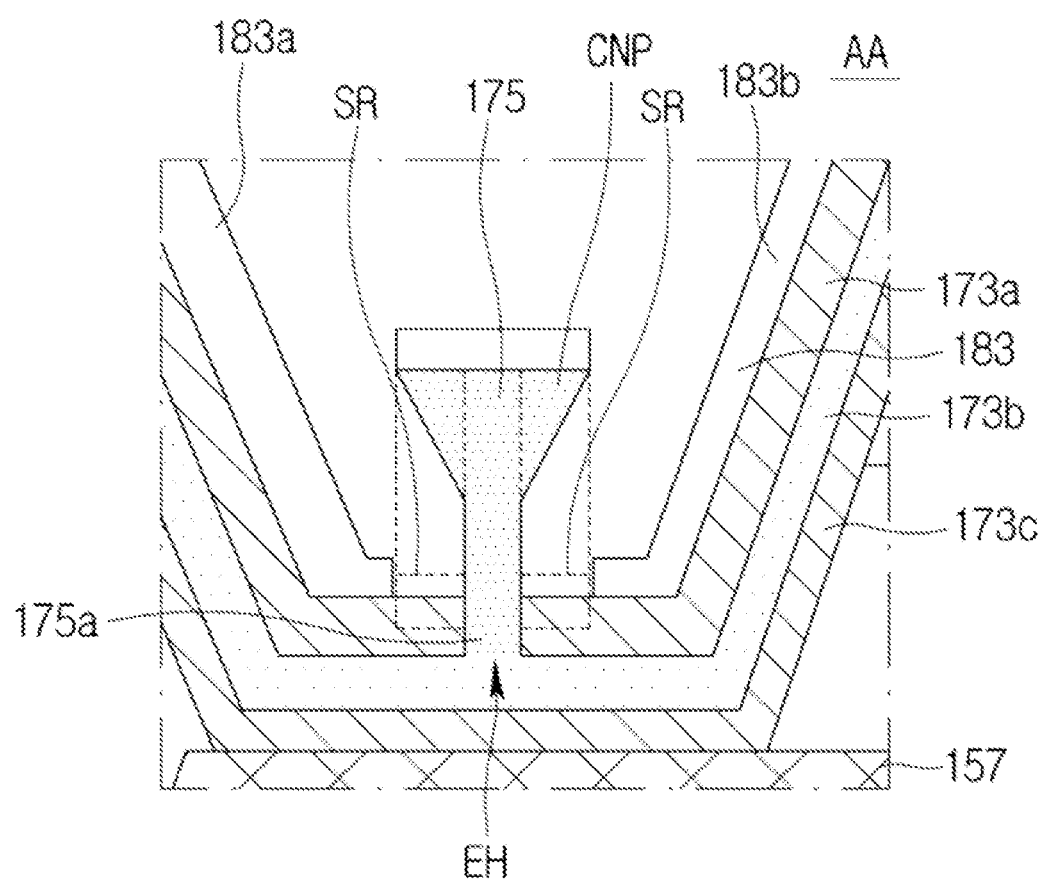

Referring to FIGS. 15 and 16, within the second contact hole CH2, when the electron auxiliary layer 183 is deposited on the connection electrode 173, diffusing ions are blocked by the shape of the protrusion 175 and do not reach the shade region SR. As a result, the electron auxiliary layer 183 may not be deposited in the shade region SR. In other words, by depositing the electron auxiliary layer 183 on the protrusion 175, the shade region SR in which the electron auxiliary layer 183 is not formed may be formed.

According to aspects, the electron auxiliary layer 183 may be formed in such a manner as to be discontinuous within the second contact hole CH2, and may include two parts 183a and 183b placed spaced apart from each other. That is, the two parts 183a and 183b spaced apart from each other may be placed on opposite sides with the protrusion 175 in the center.

Since the electron auxiliary layer 183 is formed in such a manner as to be discontinuous within the second contact hole CH2, the electron auxiliary layer 183 does not cover the shade region SR. Accordingly, a portion of the connection electrode 173 may be exposed.

According to aspects, the electron auxiliary layer 183 may be placed on the top of the protrusion 175.

Figure 17:
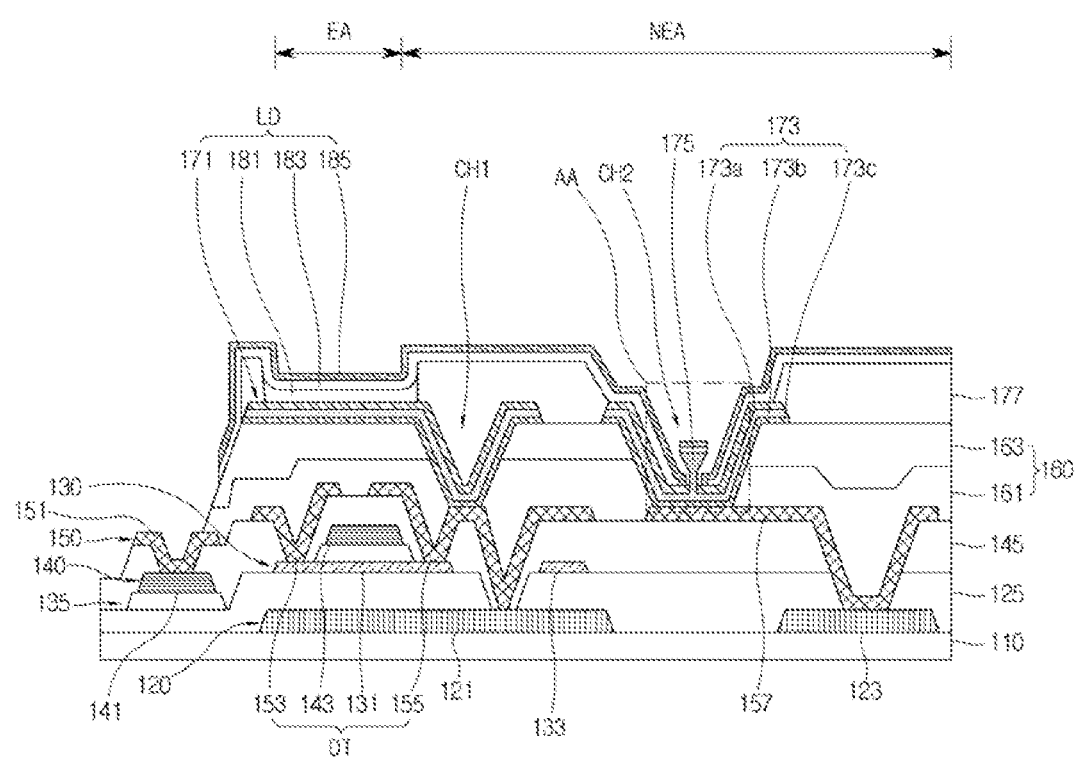
Figure 18:
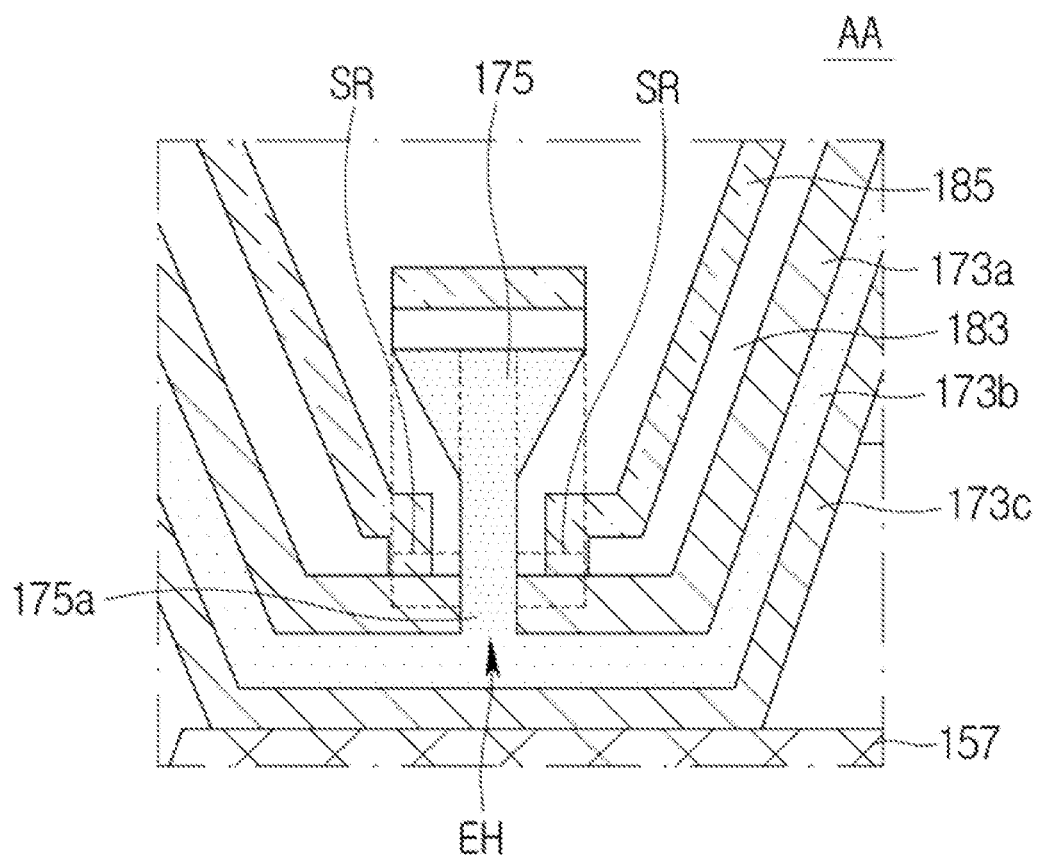

Referring to FIGS. 17 and 18, the cathode electrode 185 may be formed on the electron auxiliary layer 183. According to aspects, the cathode electrode 185 may be formed through a deposition process. For example, the cathode electrode 185 may be formed through a vertical deposition process or a sputtering process.

The cathode electrode 185 may be deposited on the surface in such a manner as to cover the electron auxiliary layer 183 and the protective layer 160. According to aspects, the cathode electrode 185 may be formed in such a manner as to be placed in the shade region SR. For example, the cathode electrode 185 may be formed in the shade region SR by using a deposition method such as sputtering.

As described above, since the electron auxiliary layer 183 is not formed in the shade region SR, the first electrode 173a of the connection electrode 173 is exposed in the shade region SR without being covered by the electron auxiliary layer 183. Since the cathode electrode 185 is formed in the shade region SR, the cathode electrode 185 may be in direct contact with the first electrode 173a in the shade region SR.

Accordingly, the cathode electrode 185 may be connected to the auxiliary electrode 157 through the connection electrode 173, so that the low-potential driving voltage ELVSS may be supplied stably to the cathode electrode 185.

The cathode electrode 185 may include two parts placed in such a manner as to be separate from each other in the second contact hole CH2. For example, the cathode electrode 185 may be placed on the electron auxiliary layer 183 positioned on the protrusion 175.

Figure 19:
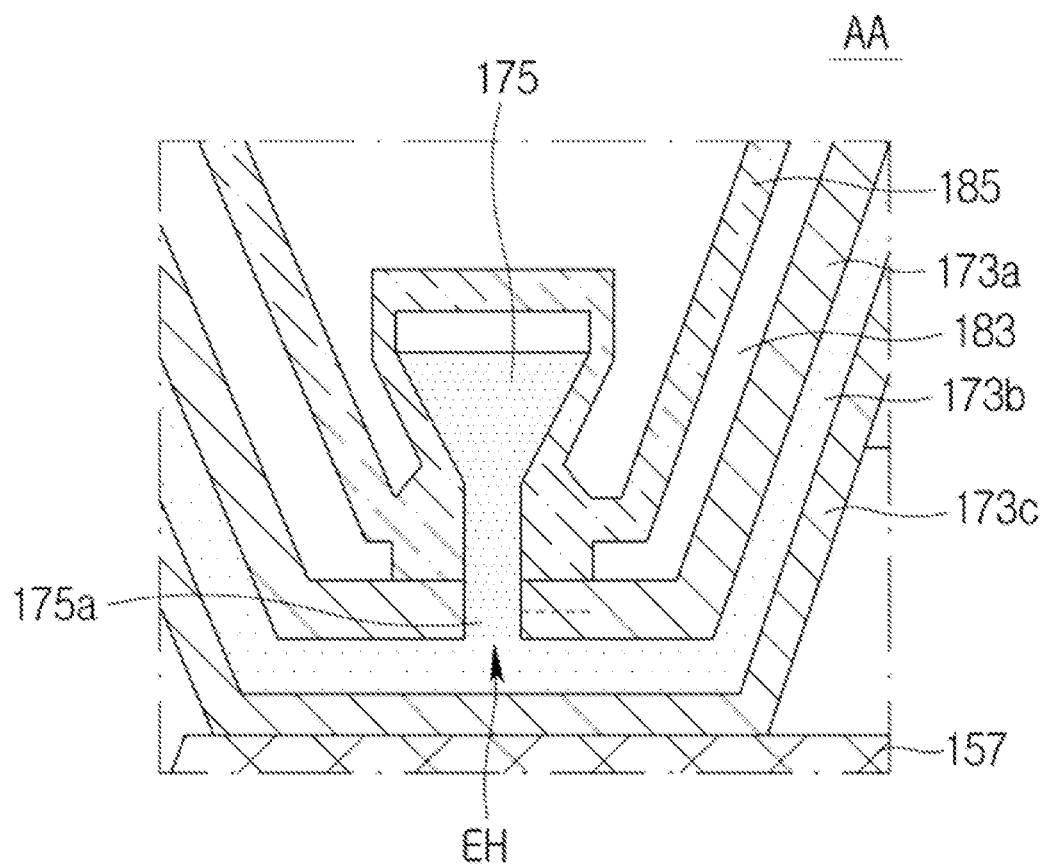

The cathode electrode 185 may be formed in such a manner as to be continuous in the second contact hole CH2 rather than separate from each other. For example, as shown in FIG. 19, the cathode electrode 185 may be placed in such a manner as to wholly cover the protrusion 175.

Figure 20:
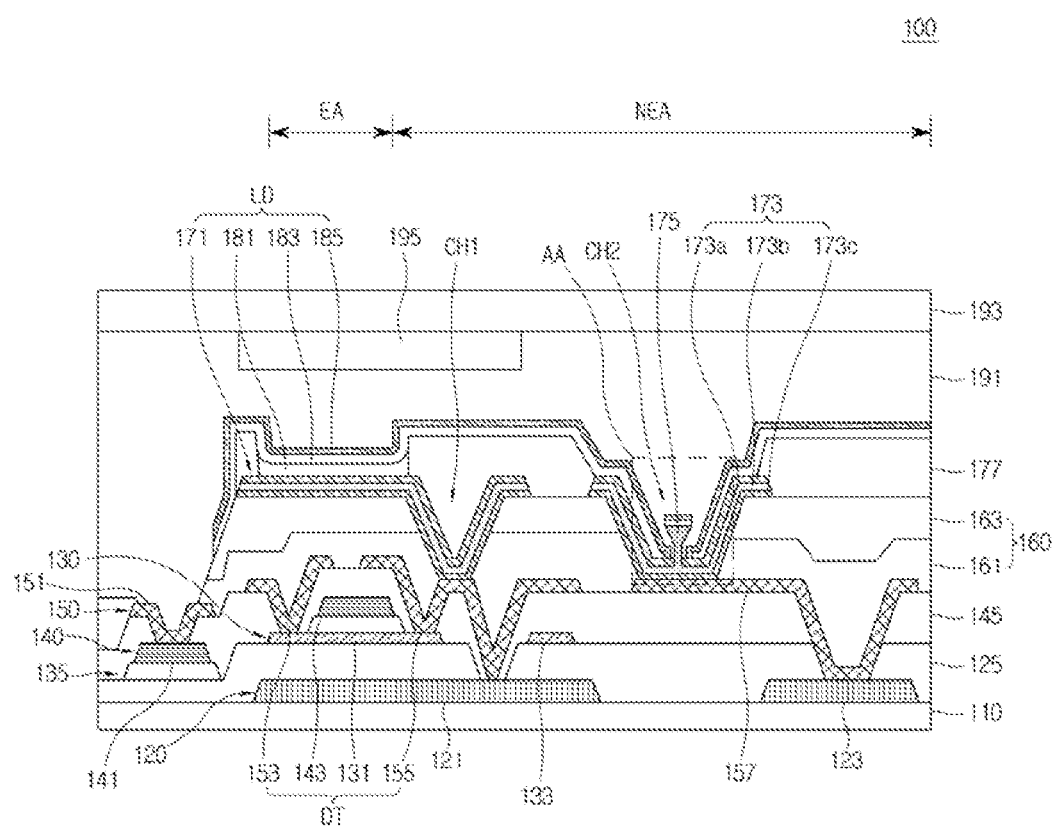

Referring to FIG. 20, the encapsulation layer 191 may be formed on the cathode electrode 185. The encapsulation layer 191 may be formed in a multi-layer structure including an inorganic layer and an organic layer. According to aspects, the inorganic layer capable of preventing penetration of foreign matter or moisture from the outside may be formed, and the organic layer planarizing an irregularity of the lower structure may be formed on the inorganic layer. For example, the organic layer may be formed in such a manner as to be thicker than the inorganic layer.

On the encapsulation layer 191, the upper substrate 193 may be placed. According to aspects, the upper substrate 193 may be attached on the encapsulation layer 191 by using an adhesive, or the like.

In addition, between the upper substrate 193 and the encapsulation layer 191, the color filter 195 may be formed. According to aspects, the color filter 195 may be formed on a surface of the upper substrate 193 by being subjected to patterning, and the surface of the upper substrate 193 on which the color filter 195 is formed and the encapsulation layer 191 may be attached to each other. However, aspects of the present disclosure are not limited thereto.

Figure 21:
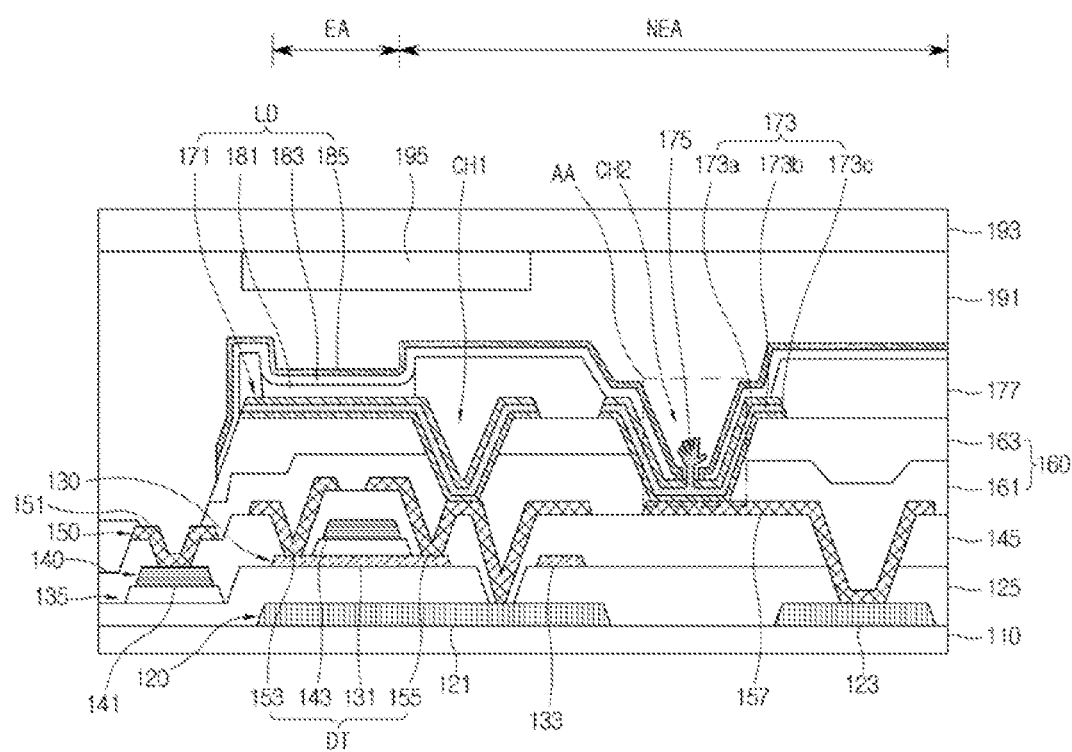
Figure 22:
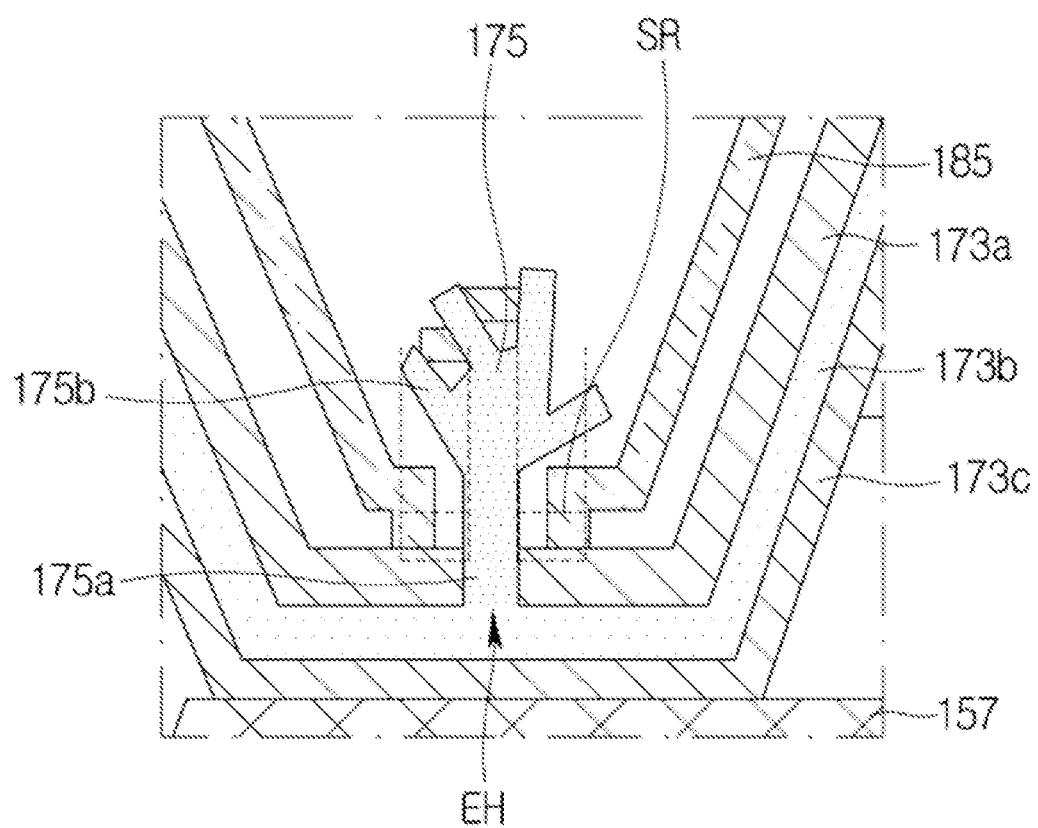

FIG. 21 is a diagram showing a display panel according to aspects of the present disclosure. FIG. 22 is an enlarged view of portion AA of FIG. 21. The shape of a protrusion 175 of a display panel 100A of FIG. 21 is different from the shape of the protrusion 175 of the display panel 100 of FIG. 3.

Referring to FIGS. 1 to 22, the connection electrode 173 may be placed on the auxiliary electrode 157 in the first direction. The first direction DR1 may be a horizontal direction, but is not limited thereto.

In the connection electrode 173, an exposure hole EH formed in the first electrode 173a may be placed. The exposure hole EH may penetrate through a portion of the first electrode 173a and may thus expose the second electrode 173b.

The protrusion 175 may extend from the second electrode 173b and may protrude through the exposure hole EH. According to aspects, the protrusion 175 may extend from the second electrode 173b in a second direction DR2, and may be formed protruding through the exposure hole EH which is a space (gap) in the first electrode 173a. For example, the second direction may be a vertical direction, but is not limited thereto. The second direction may be any direction that intersects the first direction DR1.

According to aspects of the present disclosure, the protrusion 175 may form a shade region SR on the connection electrode 173.

The protrusion 175 may have a portion protruding from the connection electrode 173 and extending in the first direction DR1 in which the connection electrode 173 is placed. Because of this portion, the shade region SR shaded by the protrusion 175 may be formed on the connection electrode 173.

The protrusion 175 may have a trunk 175a placed in the first electrode 173a and protruding from the second electrode 173b; and a crown 175b extending from the trunk 175a and having a portion extending in the first direction DR1. The crown 175b may have the portion extending in the direction (for example, the first direction DR1) in which the connection electrode 173 is placed. Because of this portion, the shade region SR may be formed on the connection electrode 173.

The crown 175b of the protrusion 175 may include multiple radial projections. In the meantime, it should be understood that aspects of the present disclosure are not limited by the shape of the protrusion 175, and any shapes of the protrusion 175 capable of forming the shade region SR are included in aspects of the present disclosure.

As will be described later, in the case where the electron auxiliary layer 183 is deposited on the connection electrode 173, the shade region SR may refer to a region in which the electron auxiliary layer 183 is not deposited due to the protrusion 175. That is, in the shade region SR, the electron auxiliary layer 183 may not be deposited and the first electrode 173a may be exposed.

The electron auxiliary layer 183 may be placed in a region on the connection electrode 173 except the shade region SR. For example, the electron auxiliary layer 183 may be placed in such a manner as not to overlap the shade region SR.

The cathode electrode 185 may be placed on the connection electrode 173, and may be placed in such a manner as to cover the electron auxiliary layer 183. In addition, the cathode electrode 185 may be placed in the shade region SR, and may be in contact with the first electrode 173a in the shade region SR. As described above, the first electrode 173a of the connection electrode 173 in the shade region SR is exposed without being covered by the electron auxiliary layer 183, so that the cathode electrode 185 may be in direct contact with the first electrode 173a and may receive the low-potential driving voltage ELVSS transmitted from the auxiliary electrode 157.

According to aspects of the present disclosure, since the cathode electrode 185 may be connected to the auxiliary wire 123 through the auxiliary electrode 157, the power supplied through the auxiliary wire 123 is supplied stably to the cathode electrode 185, whereby the operating characteristics of the light-emitting element LD may be enhanced.

Figure 23:
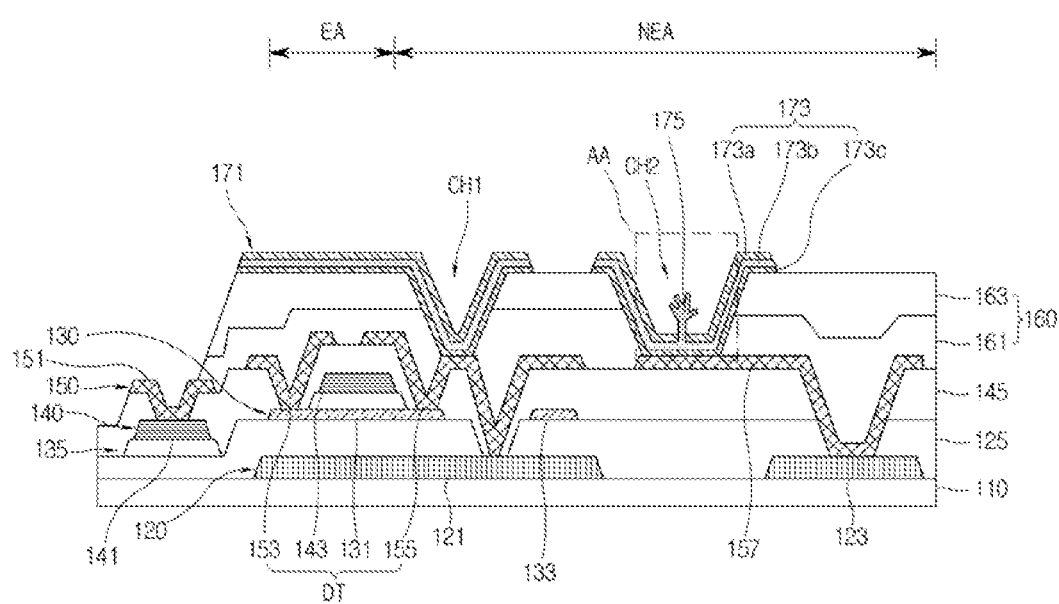

FIGS. 23 to 27 are diagrams showing a method of manufacturing the display panel shown in FIG. 21. FIG. 23 shows the substrate 100 on which the exposure hole EH is formed by performing patterning on the upper portion of the connection electrode 173.

Figure 24:
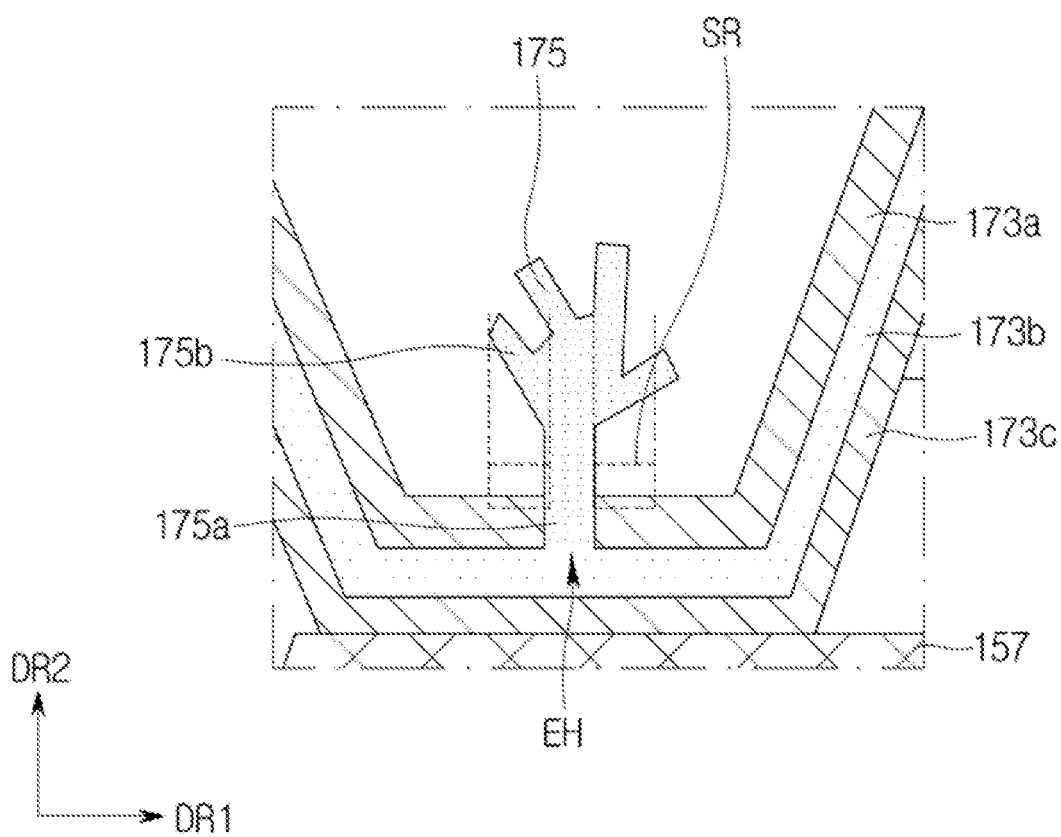

Referring to FIGS. 23 and 24, the protrusion 175 may be formed protruding from the second electrode 173b exposed through the exposure hole EH.

The protrusion 175 may be formed in such a manner as to be irregular. According to aspects, the trunk 175a may be formed in the second direction DR2 from the exposure hole EH, and the crown 175b may extend from the trunk 175a and may have a portion formed in the first direction DR1. For example, a portion of the crown 175b may include multiple projections extending in the first direction DR1.

By the crown 175b including the projections of the protrusion 175, the shade region SR may be formed on the first electrode 173a of the connection electrode 173.

Figure 25:
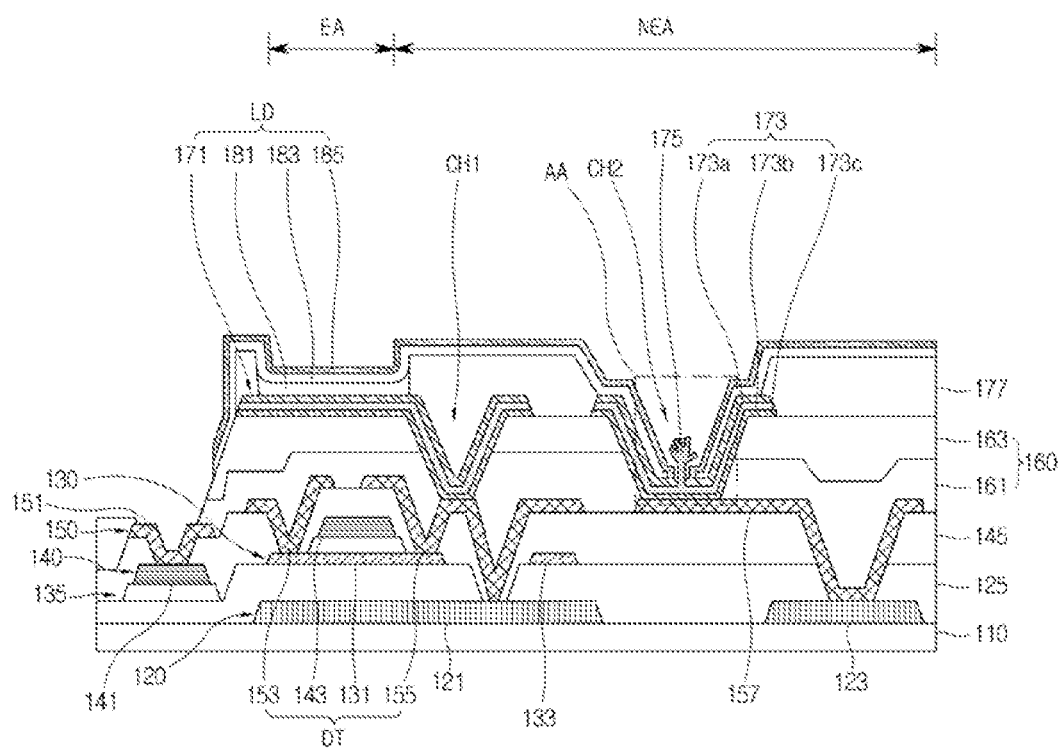
Figure 26:
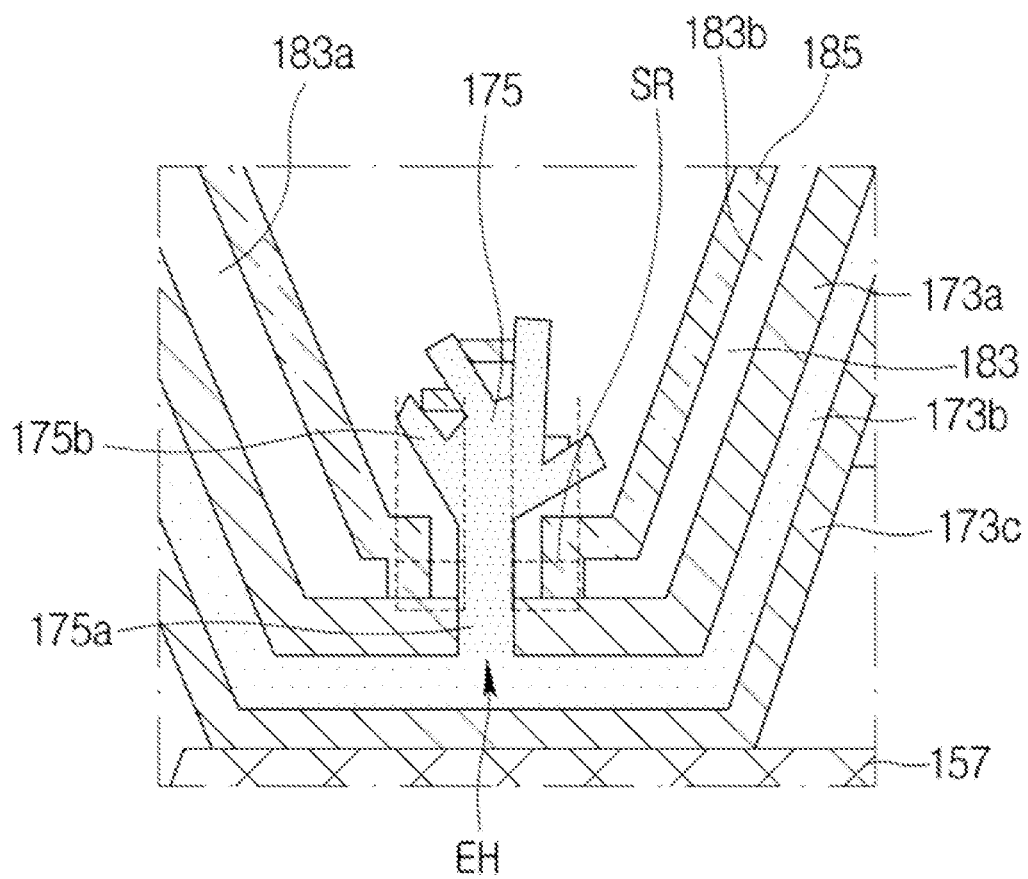
Figure 27:
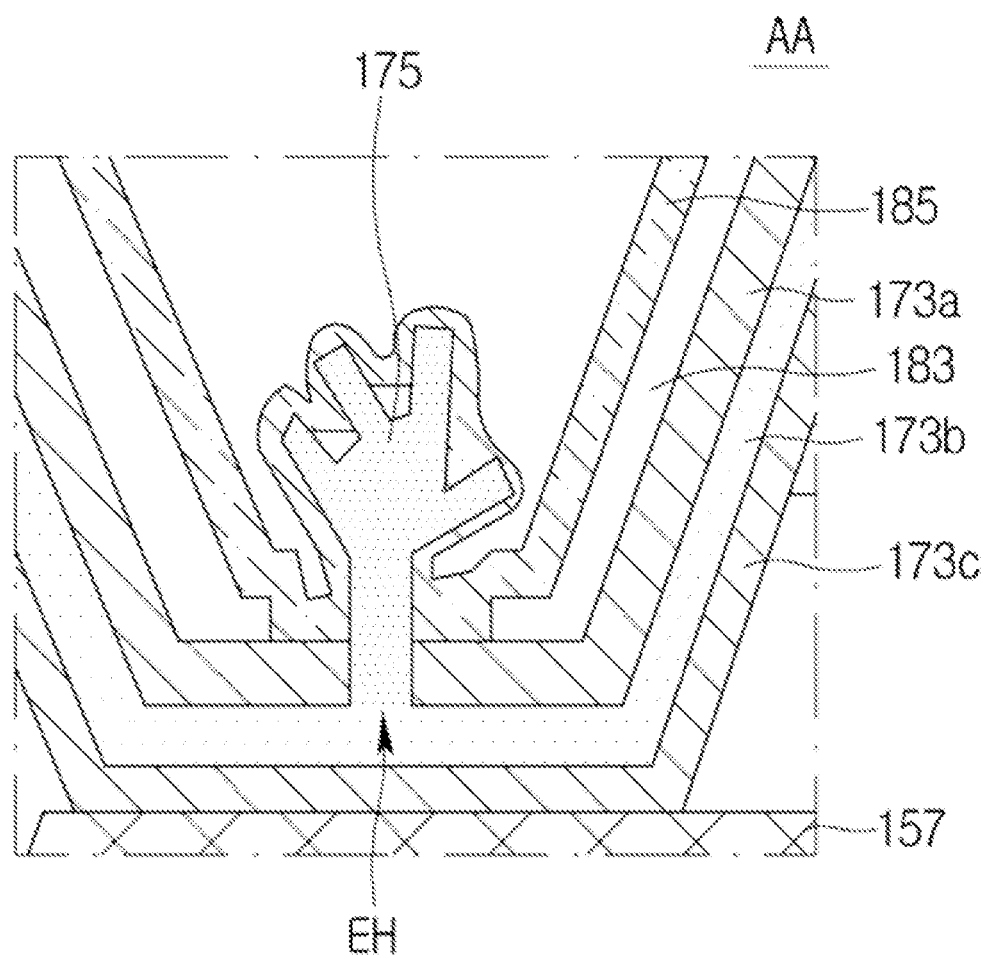

Referring to FIGS. 25 to 27, the light-emitting material layer 181 may be formed, and the electron auxiliary layer 183 may be formed on the light-emitting material layer 181. According to aspects, the electron auxiliary layer 183 may be formed by a deposition process.

When the electron auxiliary layer 183 is deposited on the connection electrode 173 within the second contact hole CH2, the electron auxiliary layer 183 may not be deposited in the shade region SR. According to aspects, the electron auxiliary layer 183 may be formed in such a manner as to be discontinuous within the second contact hole CH2, and may include two parts 183a and 183b placed spaced apart from each other. That is, the two parts 183a and 183b spaced apart from each other may be placed on opposite sides with the protrusion 175 in the center.

Since the electron auxiliary layer 183 is formed in such a manner as to be discontinuous within the second contact hole CH2, the electron auxiliary layer 183 does not cover the shade region SR. Accordingly, a portion of the connection electrode 173 may be exposed.

The cathode electrode 185 may be formed on the electron auxiliary layer 183. According to aspects, the cathode electrode 185 may be formed through a deposition process. The cathode electrode 185 may be deposited on the surface in such a manner as to cover the electron auxiliary layer 183 and the protective layer 160. According to aspects, the cathode electrode 185 may be formed in such a manner as to be placed in the shade region SR.

Accordingly, the cathode electrode 185 may be connected to the auxiliary electrode 157 through the connection electrode 173, so that the low-potential driving voltage ELVSS may be supplied stably to the cathode electrode 185.

The cathode electrode 185 may include two parts placed in such a manner as to be separate from each other in the second contact hole CH2. For example, the cathode electrode 185 may be placed between the projections of the protrusion 175.

The cathode electrode 185 may be formed in such a manner as to be continuous in the second contact hole CH2 rather than separate from each other. For example, as shown in FIG. 27, the cathode electrode 185 may be placed in such a manner as to wholly cover the projections of the protrusion 175.

According to aspects of the present disclosure, the cathode electrode 185 of the light-emitting element LD may be connected to the auxiliary wire 123 through the connection electrode 173, so that the power supplied through the auxiliary wire 123 may be supplied stably to the cathode electrode 185.

Accordingly, the light-emitting element LD of the aspects of the present disclosure may be driven stably.

The present disclosure has been described with reference to the aspects shown in the drawings for illustrative purposes, and those skilled in the art to which the present disclosure pertains will easily understand that the present disclosure may be modified in various ways and that other equivalent aspects are possible. Accordingly, the scope of the present disclosure should be determined by the technical idea of the appended claims.

What is claimed is:

1. A display panel comprising:
a substrate including an emission area and a non-emission area;
an auxiliary electrode placed in the non-emission area and supplied with power for driving the display panel;
a protective layer placed on the auxiliary electrode;
a contact hole penetrating through the protective layer and exposing the auxiliary electrode;
a connection electrode in contact with the auxiliary electrode within the contact hole;
an electron auxiliary layer placed on the connection electrode;
a cathode electrode placed on the electron auxiliary layer; and
a protrusion protruding from the connection electrode,
wherein the protrusion has a shade region on the connection electrode, and
wherein the cathode electrode is in contact with the connection electrode in the shade region,
wherein the connection electrode comprises:
a first electrode;
a second electrode placed under the first electrode with respect to a vertical direction from the substrate; and
an exposure hole formed in the first electrode,
wherein the protrusion is formed of a same material as the second electrode and extends from the second electrode and protrudes through the exposure hole, and
wherein the first electrode is disposed under the cathode electrode with respect to the vertical direction from the substrate,
wherein the protrusion has conductivity,
wherein the cathode electrode is divided by the protrusion within the contact hole,
wherein a side of the electron auxillary layer disposed on the protrusion does not contact to the cathode electrode,
wherein an end of the first electrode extends beyond an end of the electron auxillary layer within the contact hole, and directly contacts a side of the protrusion, and
wherein the electron auxillary layer does not overlap with the shade region.

2. The display panel of claim 1, wherein the electron auxiliary layer comprises two parts placed on the connection electrode and spaced apart from each other.

3. The display panel of claim 2, wherein the protrusion is placed between the two parts of the electron auxiliary layer.

4. The display panel of claim 1, wherein the cathode electrode covers the protrusion.

5. The display panel of claim 4, wherein the cathode electrode is in contact with the first electrode within the shade region.

6. The display panel of claim 1, wherein the first electrode includes a transparent conductive metal oxide, and the second electrode includes a metal.

7. The display panel of claim 1, wherein the protrusion comprises:
a trunk extending from the connection electrode; and
a crown extending from the trunk, and configured to form the shade region.

8. The display panel of claim 7, wherein the crown has a reverse-tapered shape.

9. The display panel of claim 7, wherein the electron auxiliary layer is placed on the crown.

10. The display panel of claim 7, wherein the crown comprises multiple projections formed in a radial shape.

11. The display panel of claim 10, wherein the electron auxiliary layer and the cathode electrode are placed in an area between the multiple projections.

12. A display panel comprising:
a substrate including an emission area and a non-emission area;
an auxiliary electrode disposed in the non-emission area and supplied with power for driving the display panel;
a protective layer disposed on the auxiliary electrode;
a contact hole penetrating through the protective layer and exposing the auxiliary electrode;
a connection electrode in contact with the auxiliary electrode connected to a power supply line and transmitting a low potential driving voltage (ELVSS) to a light emitting element;
an electron auxiliary layer disposed on the connection electrode;
a cathode electrode disposed on the electron auxiliary layer; and a protrusion formed of a same material as at least part of the connection electrode and protruding from the connection electrode, wherein the protrusion includes a lower portion extending from the connection electrode and an upper portion and vertically and horizontally extending from the lower portion, wherein the upper portion is formed of a same material as the lower portion, and wherein the cathode electrode is in contact with the connection electrode under the upper portion, wherein the connection electrode col prises:
   a first electrode;
   a second electrode disposed under the first electrode; and
   an exposure hole disposed in the first electrode, wherein the first electrode is disposed under the cathode electrode with respect to a vertical direction from the substrate, wherein the cathode electrode is divided by the protrusion within the contact hole, wherein a side of the electron auxillary layer disposed on the protrusion does not contact to the cathode electrode, wherein an end of the first electrode extends beyond an end of the electron auxillary layer within the contact hole, and directly contacts a side of the protrusion, and wherein the electron auxillary layer does not overlap with the upper portion.

13. The display panel of claim 12, wherein the first electrode and the second electrode have a same contour and have portions extended beyond the protrusion.

14. The display panel of claim 12, wherein the connection electrode comprises a third electrode disposed under the second electrode.

* * * * *